United States Patent
Yamazaki et al.

[11] Patent Number: 6,048,758
[45] Date of Patent: Apr. 11, 2000

[54] METHOD FOR CRYSTALLIZING AN AMORPHOUS SILICON THIN FILM

[75] Inventors: Shunpei Yamazaki, Tokyo; Hisashi Ohtani, Kanagawa; Akiharu Miyanaga, Kanagawa; Satoshi Teramoto, Kanagawa, all of Japan

[73] Assignee: Semiconductor Energy Laboratory Co., Ltd., Japan

[21] Appl. No.: 08/789,193

[22] Filed: Jan. 23, 1997

[30] Foreign Application Priority Data

Jan. 23, 1996 [JP] Japan .................................. 8-028649
Jan. 26, 1996 [JP] Japan .................................. 8-032872

[51] Int. Cl.$^7$ ............................ H01L 21/00; H01L 21/84
[52] U.S. Cl. ........................ 438/166; 438/486; 438/487
[58] Field of Search ................... 438/166, 486, 438/487, 402, FOR 261, FOR 184, FOR 201, FOR 155

[56] References Cited

U.S. PATENT DOCUMENTS

| | | | |
|---|---|---|---|
| 5,543,636 | 8/1996 | Yamazaki | 257/66 |
| 5,707,882 | 1/1998 | Hamada et al. | 438/166 |
| 5,759,879 | 6/1998 | Iwasaki | 438/166 |
| 5,789,284 | 8/1998 | Yamazaki et al. | 438/166 |
| 5,797,999 | 8/1998 | Sannomiya et al. | 438/97 |
| 5,837,569 | 11/1998 | Makita et al. | 438/166 |
| 5,859,443 | 1/1999 | Yamazaki et al. | 257/65 |

*Primary Examiner*—M Wilczewski
*Attorney, Agent, or Firm*—Fish & Richardson P.C.

[57] ABSTRACT

A little amount of nickel is introduced into an amorphous silicon film formed on a glass substrate to crystallize the amorphous silicon film by heating. In this situation, nickel elements remain in a crystallized silicon film. An amorphous silicon film is formed on the surface of the crystallized silicon film and then subjected to a heat treatment. With this heat treatment, the nickel elements are diffused in the amorphous silicon film, thereby being capable of lowering the concentration of nickel in the crystallized silicon film.

29 Claims, 10 Drawing Sheets

IMPURITY ION INJECTION AND LASER LIGHT IRRADIATION

IMPURITY ION INJECTION AND LASER LIGHT IRRADATION

METHOD FOR CRYSTALLIZING AN AMORPHOUS SILICON THIN FILM

BACKGROUND OF THE INVENTION

1. Field of the Invention

The present invention relates to a method for manufacturing a silicon semiconductor thin film having crystallinity which is formed on a substrate having an insulating surface such as a glass substrate.

2. Description of the Related Art

In recent years, attention has been paid to a technique by which a thin-film transistor is formed using a silicon thin film formed on a glass substrate. The thin-film transistor of this type is mainly used for an active matrix liquid-crystal electro-optical device, and other thin-film integrated circuits. The liquid-crystal electro-optical device is designed such that liquid crystal is sealingly interposed between a pair of glass substrates, and an electric field is applied to the liquid crystal, to thereby change the optical characteristic of the liquid crystal, thus conducting image display.

In particular, the active matrix liquid-crystal display unit using the thin-film transistors is characterized by arranging the thin-film transistors as switches for the respective pixels, and controlling charges held by pixel electrodes. The active matrix liquid display unit is used for the display of a variety of electronic equipments (for example, a portable word processor or a portable computer) because it can display a fine image at a high speed.

An amorphous silicon thin film is generally employed for the thin-film transistor used in the active matrix liquid-crystal display unit.

However, the thin-film transistor using the amorphous silicon thin film suffers from problems stated below.

(1) A higher-quality image display cannot be conducted because the characteristic is low.

(2) A peripheral circuit for driving the thin-film transistor disposed in a pixel cannot be constituted.

The above problem (2) can be classified into two problems one of which is that a CMOS circuit cannot be constituted, since a p-channel type thin-film transistor is not put into practical use for the thin-film transistor using the amorphous silicon thin film, and the other is that the peripheral drive circuit cannot be constituted, since the thin-film transistor using the amorphous silicon thin film cannot conduct high-speed operation and also does not allow a large current to flow therein.

As a method for solving those problems, there is a technique by which a thin-film transistor is formed using a crystalline silicon thin film. As methods for obtaining the crystalline silicon thin film, there are a method for subjecting the amorphous silicon film to a heat treatment, and a method for irradiating a laser light onto the amorphous silicon film.

The method for crystallizing the amorphous silicon film through the heat treatment generally suffers from problems stated below. In order to form the thin-film transistor used in the liquid-crystal electro-optical device, the thin-film transistor is usually required to be formed on a translucent substrate. The translucent substrate may be formed of a quartz substrate or a glass substrate. However, the quartz substrate is expensive and therefore cannot be used in the liquid-crystal electro-optical device which suffers from such a technical problem that the costs must be decreased. Hence, although the glass substrate is generally used, it suffers from such a problem that its heat resistant temperature is low.

It has been proved from the experiment that a temperature of 600° C. or higher is required to crystallize the amorphous silicon film by heating, and also it has been proved from the experiment that several tens hours are required as a heating period. Such a high-temperature and long-period heating cannot be conducted on a large-area glass substrate.

Also, there has been known a technique in which the amorphous silicon film is crystallized by the irradiation of a laser light. However, it is difficult to uniformly irradiate a laser light over a large area of the film, or to irradiate a laser light while maintaining a given irradiation power as a real problem.

SUMMARY OF THE INVENTION

The present invention has been made to eliminate the above problems, and therefore an object of the present invention is to provide a method for manufacturing a semiconductor thin film, which uses the catalytic action of a metal element and manufactures a crystalline silicon film excellent in characteristics.

In order to solve the above problem, the present invention has been achieved by the provision of a method for manufacturing a semiconductor thin film, comprising the steps of:

introducing metal elements into an amorphous silicon film;

crystallizing said amorphous silicon film to obtain a crystalline silicon film;

forming a protective film on said crystalline silicon film;

forming an amorphous silicon film containing impurities therein on said protective film;

diffusing said metal elements in said amorphous silicon film containing the impurities therein; and removing said amorphous silicon film containing the impurities therein with said protective film as an etching stopper.

In the above method, the amorphous silicon film to be crystallized may be formed of a film which is formed on a glass substrate or a glass substrate on which an insulating film is formed through a plasma CVD method or a low pressure thermal CVD method.

Also, the metal element may be one kind of element or plural kinds of elements selected from Fe, Co, Ni, Ru, Rh, Pd, Os, Ir, Pt, Cu and Au. Those metal elements have the catalytic action that promotes the crystallization of silicon, and Nickel (Ni) has the particular catalytic action among those metal elements.

A method for introducing the above metal elements may be a method for forming a layer made of the above-mentioned metal or a layer containing the metal therein on the surface of the amorphous silicon film. Specifically, there are methods for forming a metal-element layer or a layer containing the metal elements therein through the CVD method, the sputtering method, the vapor deposition method or the like, and a method for coating solution containing the metal elements therein on the amorphous silicon film.

However, in case of using the CVD method, the sputtering method, the vapor deposition method or the like, since it is difficult to form a very-thin uniform film, the metal elements non-uniformly exist on the amorphous silicon film, which leads to such a problem that the metal elements are liable to locally exist at the time of crystal growth. On the other hand, the method of using the solution is very preferable, since the concentration of the metal elements can be readily controlled, and the metal elements can be held in uniform contact with the surface of the amorphous silicon film.

In order to crystallize the amorphous silicon film into which the metal elements that promote the crystallization of silicon are introduced, heating may be conducted at a temperature of 450° C. or higher. The upper limit of the heating temperature is limited by the heat resistant temperature of the glass substrate used as a substrate. In case of the glass substrate, the heat resistant temperature can be regarded as a strain point of glass. For example, because a Corning 1737 glass substrate is 667° C. in strain point, the heating temperature can be set to about 620° C., and it is proper from the viewpoints of the heat resistance or the productivity of the glass substrate.

Also, in case of using material that withstands even a temperature of 1,000° C. or higher such as a quartz substrate as a substrate, the heating temperature can be increased in accordance with its heat resistant temperature. In addition, the higher the heating temperature is, the more excellent crystallinity can be obtained for the film.

In the above constitution, the step of forming the protective film may be a step of forming a silicon oxide film, silicon nitride film, and a silicon oxynitride film through the plasma CVD method. Alternatively, there can be applied a step of oxidizing the surface of the crystalline silicon film by the irradiation of UV rays, heating or the like in the air.

The protective film is adapted to function as an etching stopper and may be a film by which selectivity can be obtained when etching the silicon film. Also, the thickness of the protective film may be about several tens to 100 Å. The reason why the protective film is thus thinned is that the metal elements need to be movable from the crystalline silicon film through the protective film.

Furthermore, in the above constitution, the amorphous silicon film containing the impurities therein is adapted to function as a film for diffusing the metal elements and may be an amorphous silicon film which is formed through the general CVD method. For example, there can be used an amorphous silicon film which is obtained, for example, through a method identical with a method for forming the amorphous silicon film which is a start film of the crystalline silicon film which has been crystallized by heating.

Also, the impurities contained in the amorphous silicon film are at least one kind of element selected from oxygen, carbon and nitrogen. For example, in the amorphous silicon film, the concentration of impurities is set to $1\times 10^{19}$ to $1\times 10^{21}$ atoms cm$^{-3}$ when the impurities are oxygen, and to $1\times 10^{17}$ to $1\times 10^{20}$ atoms cm$^{-3}$ when the impurities are carbon or nitrogen.

Because the silicon film containing the impurities therein is amorphous in quality (for example, having a large number of dangling bonds, defects and so on), the film per se has an effect of gettering the metal elements such as nickel. However, in the present invention, impurities are allowed to be contained in the silicon film so that the amorphous silicon film has more elements of gettering the metal elements. The elements of this type may be impurities, defects caused by binding of Si and the impurities, oxygen between the silicon binding, and so on.

An increase of the concentration of the impurities higher than the metal elements in the crystalline silicon film is effective in capturing more metal elements in the silicon film. Furthermore, it is effective that the amorphous silicon film is made thicker than the thickness of the crystalline silicon film. This is because the volume ratio of the amorphous silicon film to the crystalline silicon film can be increased as the silicon film is thick. Also, that the impurities such as oxygen are contained with high density in the amorphous silicon film enables more defects to be contained in the film when the silicon film is crystallized by heating, with the result that the above metal element can be gettered in the periphery of those defects.

Moreover, as a film by which the metal elements are diffused, an amorphous $Si_xGe_{1-x}$ film (0<x<1) containing the above impurities therein can be used. In order to obtain amorphous $Si_xGe_{1-x}$ film, it may be formed through the plasma CVD method using silane ($SiH_4$) and german ($GeH_4$) as raw gas.

In the above method, the step of diffusing (drawing in) the metal elements in the silicon film containing the impurities therein can be conducted by a heat treatment. The metal elements are diffused in the silicon film containing the impurity elements therein by heating. As a result, because, in fact, the silicon film enables the metal elements in the crystalline silicon film to be drawn out, a crystalline silicon film which is low in the concentration of the metal elements and excellent in crystallinity can be obtained.

For example, if the silicon film containing the impurities therein has substantially the same thickness as that of the crystalline silicon film, the concentration of the metal elements in the crystalline silicon film can be set to ½ or less in average by heating.

It should be noted that because the above heat treating step is conducted to diffuse the metal elements outside the crystalline silicon film, the lower limit of the heating temperature is defined by a temperature at which the metal elements can be diffused. Since the effect of reducing the concentration of the metal elements in the crystalline silicon film is more enhanced as the heating temperature is high, it is preferable that heating is conducted at a temperature as high as possible. Hence, from the viewpoint of forming the crystalline silicon film on the substrate, the upper limit of the heating temperature is defined by the strain point or lower of the substrate.

It should be noted that the strain point of the substrate is a criterion for setting the heating temperature, and the heating temperature needs to be set to a temperature at which the deformation or the strain of the substrate is permissible. For example, as represented by RTP, heating can be conducted at a temperature higher than the strain point or higher of the substrate if it is a short-period of high-temperature heat treatment. Furthermore, the temperature and period of time necessary for the heat treatment depend on the pattern of the film to be processed, the rule of a design and so on. Hence, the heat treatment may be conducted at 550 to 1,050° C. for about several minutes to 10 hours with the above conditions being satisfied.

There is a case in which when the heating temperature is set as high as possible as described above, the silicon film containing the impurities therein is crystallized due to the catalytic action of the metal elements which are diffused from the crystalline silicon film with the result that the silicon film is formed into a crystalline silicon film. Similarly, in this case, even though silicon containing the impurities therein is crystallized as described above, a large number of defects are formed inside of silicon and act as the selective gettering sink.

Because the crystallizing step is progressed while the metal elements are diffused, crystal growth is progressed from the surface of the crystalline silicon film toward the silicon film containing the impurities therein. Because the metal elements such as nickel have a tendency to concentrate on the tip portion of the crystal growth, even though the crystal growth is progressed, the concentration of the nickel elements in the crystalline silicon film can be reduced, and in addition, a region in which the nickel elements are segregated can be eliminated.

It should be noted that because the impurities are contained in the silicon film which allows the metal elements to be diffused, even though the silicon film is brought into crystallinity, two silicon films can be made different in quality from each other through the protective film.

Further, in the present invention, even though the step of diffusing the metal elements in the amorphous silicon film containing the impurities therein is conducted at a temperature at which the amorphous silicon film containing the impurities therein is not crystallized, its effect can be sufficiently obtained.

This is because the impurities such as oxygen are contained at a high concentration in the amorphous silicon film, heating restrains the amorphous silicon film from being crystallized, and the metal elements can be diffused even at a temperature at which the amorphous silicon film is not crystallized.

Further, the heat treatment is conducted for a long period of time at a temperature at which the amorphous silicon film containing the impurities therein is not crystallized, thereby being capable of more reducing the concentration of the metal in the crystalline silicon film although it is gradual. This action is a remarkable characteristic which cannot be found in the case where the amorphous silicon film is crystallized.

Further, because the amorphous silicon film containing the impurities therein is not allowed to be crystallized so that the amorphous silicon film into which the metal elements have been diffused and the crystallized silicon film are different in crystallinity from each other, there can be obtained such an effect that the step of forming the protective film that functions as an etching stopper can be omitted.

The removal of the silicon film containing the impurities therein on the protective film may be achieved by the application of the wet etching method or the dry etching method. In this situation, since the protective film functions as the etching stopper, the silicon film on the protective film into which the metal elements are diffused can be readily selectively etched.

In other words, in the above method, with the formation of the protective film that functions as the etching stopper on the crystalline silicon film, the silicon film on the protective film in which the metal elements exist with a high density can be surely and selectively removed regardless of whether the silicon film on the protective film is crystallized, or not, in the step of diffusing the metal elements.

Hence, in the present invention, in case of forming the protective film, the heating temperature in the step of diffusing the metal elements may be set to a temperature at which the concentration of the nickel elements in the crystalline silicon film can be reduced to a desired value, regardless of whether the silicon film containing the impurities therein is crystallized, or not.

In particular, in the case where the silicon film containing the impurities therein is not crystallized in the step of diffusing the metal elements, the step of forming the protective film that functions as the etching stopper on the crystalline silicon film can be omitted.

Furthermore, in the above method, when halogen elements are contained in the atmosphere in the heating step of diffusing the metal elements, the gettering effect is more improved.

As a method for introducing the halogen elements, one kind or plural kinds of gases selected from HCl, HF, HBr, $Cl_2$, $F_2$ and $Br_2$ may be used. In general, hydride of halogen may be used. since halogen reacts with nickel to form vaporizable halide of metal elements by heating the silicon film in the atmosphere containing halogen elements therein, the action of removing nickel from the crystalline silicon film is more promoted. Similarly, halide of the metal elements is formed on the crystalline silicon film, thereby being capable of making the metal elements in an electrically inactive state. With the introduction of halogen elements, the concentration of the metal elements can be set to $\frac{1}{10}$ or less at the maximum in comparison with a case in which no halogen element is introduced in the heat treatment.

BRIEF DESCRIPTION OF THE DRAWINGS

The above and other objects and features of the present invention will be more apparent from the following description taken in conjunction with the accompanying drawings.

DETAILED DESCRIPTION OF THE PREFERRED EMBODIMENTS

Now, a description will be given in more detail of preferred embodiments of the present invention with reference to the accompanying drawings.

First, a specific example of one embodiment according to the present invention will be described with reference to FIG. 1. In the example shown in FIG. 1, metal elements are diffused at a temperature where an amorphous silicon film containing impurities therein is not allowed to be crystallized.

Figure 1A:
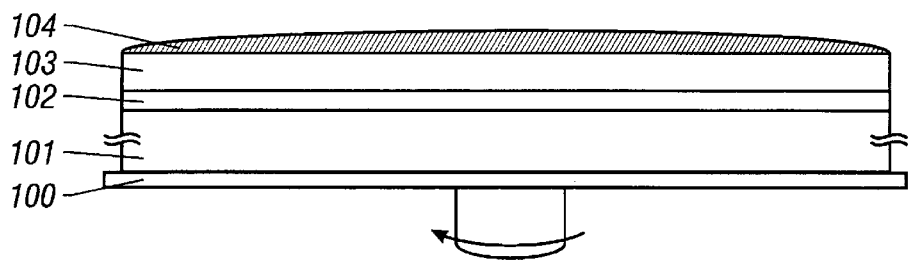
FIGS. 1A to 1D are diagrams showing a process of manufacturing a crystalline silicon film in accordance with a first embodiment of the present invention.
Figure 1B:
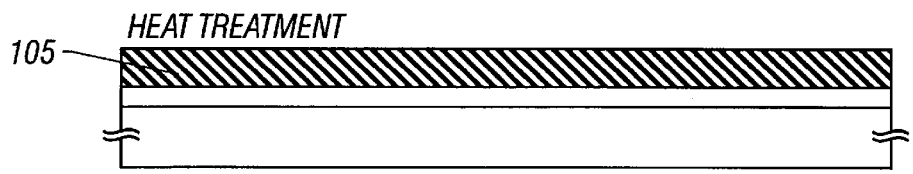

A crystalline silicon film 105 is formed on a glass substrate 101 using nickel which is metal elements that promote the crystallization of silicon. The crystallization is conducted through a heat treatment. It should be noted that a silicon oxide film 102 is formed as an underlayer film on the surface of the glass substrate 101 (FIG. 1B).

Figure 1C:
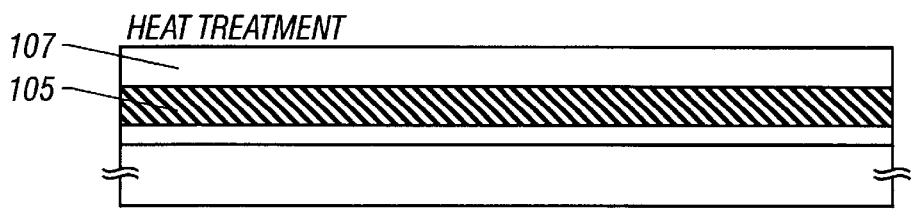

Then, as shown in FIG. 1C, an amorphous silicon film 107, for example, containing oxygen therein is formed as a film to which the metal elements are diffused, and then subjected to a heat treatment. The heat treatment is conducted at a temperature where the amorphous silicon film is prevented from being crystallized, and its heating time may be set to about 5 minutes to 10 hours. With this process, the metal elements in the crystalline silicon film 105 are gradually diffused (drawn in) in the amorphous silicon film 107. Hence, with the heat treatment for a long period of time, the concentration of the metal elements in the crystalline silicon film 105 can be reduced although it is gradual.

This action is caused because the amorphous silicon film 107 contains oxygen as impurities, and therefore silicon atoms exist in a state where they are liable to be bonded to the metal elements (a large number of dangling bondings exist).

Figure 1D:

Subsequently, with the removal of the amorphous silicon film 107, a crystalline silicon film 108 can be obtained which has the concentration of the metal elements in the crystalline silicon film 105 which is lower than the concentration of the metal elements in the amorphous silicon film 107 (FIG. 1D).

Further, a specific example of another embodiment according to the present invention will be described with reference to FIG. 3. In the example shown in FIG. 3, metal elements are diffused at a temperature where an amorphous silicon film containing impurities therein is crystallized.

Figure 3A:
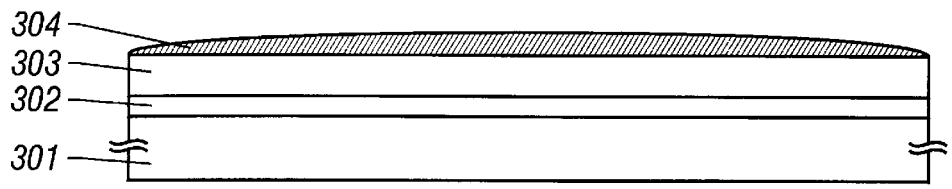
FIGS. 3A to 3E are diagrams showing a process of manufacturing a crystalline silicon film in accordance with a third embodiment of the present invention.
Figure 3B:
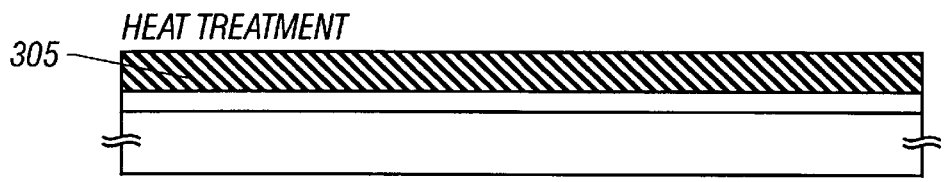

As shown in FIG. 3B, a crystalline silicon film 305 is formed on a glass substrate 301 using nickel which is a metal element that promotes the crystallization of silicon. The crystallization is conducted through a heat treatment. It should be noted that a silicon oxide film 302 is formed as an under film on the surface of the glass substrate 301.

Figure 3C:
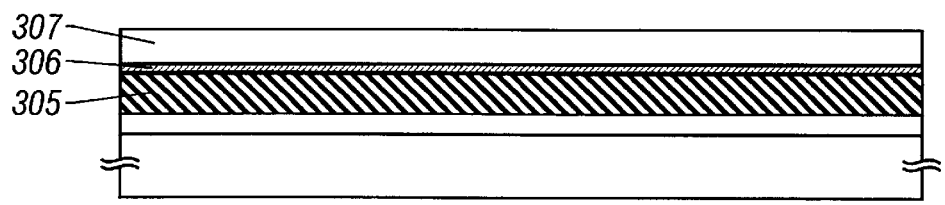

Then, as shown in FIG. 3C, the surface of the crystalline silicon film 305 is oxidized to form a silicon oxide film 306, and in addition, an amorphous silicon film 307, for example, containing oxygen therein is formed as a film to which the metal elements are diffused.

Figure 3D:
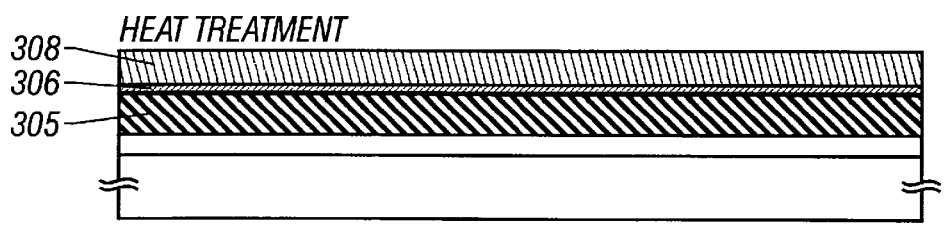

As shown in FIG. 3D, the films thus formed are subjected to a heat treatment. The heating temperature is set to a temperature of about 550 to 1,050° C., and its heating time may be set to about 5 minutes to 10 hours. With this process, the metal elements in the crystalline silicon film 305 are gradually diffused into the amorphous silicon film 307, and the amorphous silicon film 307 is crystallized. Because a crystallized silicon film 308 contains oxygen as impurities, a large number of defects are formed inside thereof and act as a gettering sink.

Figure 3E:

Subsequently, as shown in FIG. 3E, the silicon oxide film 306 and the amorphous silicon film 307 are sequentially removed, thereby being capable of obtaining a crystalline silicon film 309 having the concentration of the metal elements in the crystalline silicon film 305 which is smaller than the concentration of the metal elements in the amorphous silicon film 307.

Since the process of manufacturing the crystalline semiconductor thin film shown in FIGS. 1 and 3 can be conducted at a temperature which can be withstood by the glass substrate, it is significantly useful in a process of manufacturing a thin-film transistor formed on a glass substrate, for example, as in a liquid-crystal electro-optical device.

(First Embodiment)

A first embodiment relates to a technique by which an amorphous silicon film is formed on a glass substrate, a metal film that promotes the crystallization of silicon is introduced into the amorphous silicon film, the amorphous silicon film is crystallized by heating, an amorphous silicon film is further formed on the silicon film thus crystallized (crystalline silicon film), and thereafter the amorphous silicon film is again subjected to a heat treatment, to thereby diffuse nickel elements into the amorphous silicon film from the crystalline silicon film (the nickel elements are drawn in the amorphous silicon film), with the result that the concentration of the nickel elements in the crystalline silicon film is reduced.

FIG. 1 shows a process of manufacturing a crystalline silicon film according to this embodiment. First, an underlayer film 102 is formed on a Corning 1737 glass substrate 101 (a strain point 667° C.). The underlayer film 102 is disposed to prevent impurities or alkali ions from being diffused from the glass substrate 101 into a semiconductor thin film which will be formed later.

Hence, although a silicon nitride film is optimum as the underlayer film 102 in order to obtain the above function at the largest, since the film may be separated from the glass substrate 101 in cooperation with a stress, it is not practical. Also, although a silicon oxide film can be used as the underlayer film 102, the silicon oxide film is insufficient to obtain a barrier effect to the impurities. For those reasons, in the present invention, a silicon oxynitride film is formed as the underlayer film 102. The formation of the silicon oxynitride film as the underlayer film 102 may be conducted by the application of the plasma CVD method. As raw gases, silane, $O_2$ gas and $N_2O$ gas are used. Alternatively, TEOS gas and $N_2O$ gas are used.

In addition, it is significant to make the hardness of the underlayer film 102 as high as possible. This is because it has been proved, according to the endurance test of the thin-film transistor which has been finally obtained, that the reliability is more excellent as the underlayer film 102 is hard, that is, as the etching rate is small, and this suggests that the hardness of the under layer 102 contributes to the prevention of entrance of the impurities from the glass substrate 101.

Subsequently, an amorphous silicon film 103 is formed in thickness of 600 Å through the plasma CVD method and the low pressure thermal CVD method. The amorphous silicon film 103 will be crystallized later. It should be noted that the reason why the low pressure thermal CVD method is applied is that the quality of the crystalline silicon film as obtained is excellent. As another film forming method, the plasma CVD method may be applied. It should be noted that it is significant to prevent the impurities from being mixed in the amorphous silicon film 103 at the time of film formation.

Further, it is preferable to set the thickness of the amorphous silicon film 103 to 2,000 Å or less. The thickness of 2000 Å or more makes it difficult to remove the metal elements from the silicon film. Moreover, the lower limit of the thickness of the amorphous silicon film 103 depends on the film forming method by which how thin the film can be formed. Accordingly, the lower limit of the thickness is generally about 100 Å, and practically about 200 Å.

After the amorphous silicon film 103 has been formed, a nickel acetate solution adjusted to a predetermined concentration of nickel drops on the amorphous silicon film 103 to form a water film 104. Then, spin coating is conducted using a spinner 100 so that the nickel elements are held in contact with the surface of the amorphous silicon film 103 (FIG. 1A).

Taking residual impurities in a subsequent heating process into consideration, it is preferable that nickel nitrate is used instead of nickel acetate solution. This is because nickel acetate solution contains carbon which may be carbonated in the subsequent heating process and remain in the film.

Subsequently, a heat treatment is conducted on the amorphous silicon film 103 at a temperature of 450 to 650° C. to crystalize the amorphous silicon film 103, thus obtaining a crystalline silicon film 105. In this embodiment, the heat treatment is conducted in the nitrogen atmosphere containing hydrogen 3% at 620° C. for 4 hours. The crystal growth is disorderly progressed in a direction substantially vertical to the substrate toward the underlayer film 102 from the surface of the amorphous silicon film 103. In this specification, the crystal growth of this type is called "vertical growth" (FIG. 1B).

The lower limit of the heat treating temperature is preferably set to 450° C. or higher from the viewpoints of its effect and reproducibility. The upper limit of the heat treating temperature is preferably set to the strain point or lower of the glass substrate to be used. In this example, since the Corning 1737 glass substrate having its strain point of 667° C. is used, the upper limit is set to 650° C. with some margin.

For example, if a quartz substrate is used as the substrate, the heating temperature can be elevated up to about 900° C. In this case, a crystalline silicon film having higher crystallinity can be obtained. Also, the crystalline silicon film can be obtained in a shorter period of time.

Further, the concentration of nickel in the crystalline silicon film 105 needs to be set to $1 \times 10^{16}$ to $5 \times 10^{19}$ atoms $cm^{-3}$. For that reason, the concentration of nickel in the nickel acetate solution needs to be adjusted in the step of FIG. 1A so that the concentration of nickel in the crystalline silicon film 105 as obtained falls within the above range to a possible extent. It should be noted that the concentration of nickel is defined as the minimum value of values measured through SIMS (secondary ion mass spectroscopy).

After the crystalline silicon film 105 has been obtained, the amorphous silicon film 107 containing oxygen as impurities is formed in thickness of 600 Å through the plasma CVD method or the low pressure thermal CVD method. As a result, since the amorphous silicon film 107 contains oxygen as impurities in addition to defects or the like caused by the film quality of amorphous, it has the defects caused by oxide represented by oxygen or $SiO_x$, oxygen between silicon bonding, or the like. Therefore, it is liable to getter nickel by virtue of the film quality thereof.

Figure 11:
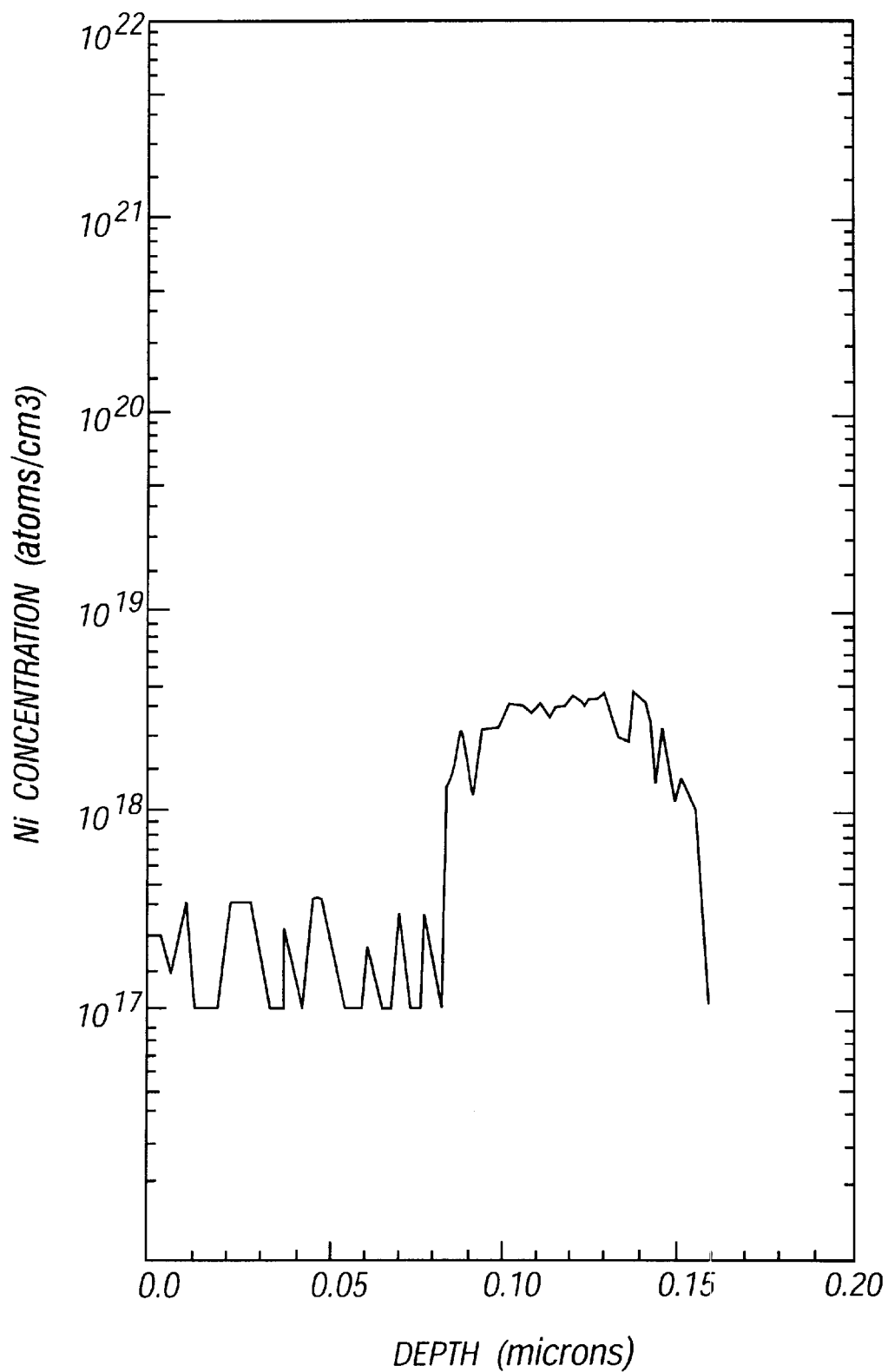
FIG. 11 is a graph showing the distribution of the concentration of nickel elements.

FIG. 11 shows the results of measuring through SIMS the distribution of concentration of nickel elements in a state where the amorphous silicon film 107 is formed. As shown in FIG. 11, the concentration of nickel elements was about $5 \times 10^{18}$ atoms $cm^{-3}$ at the maximum in the crystalline silicon film 105, and was lower than a measurement limit ($1 \times 10^{17}$ atoms $cm^{-3}$) of SIMS in the amorphous silicon film 107.

In this embodiment, in order to capture more nickel elements by the amorphous silicon film 107, taking the concentration of nickel elements in the crystalline silicon film 105 into consideration, the concentration of oxygen in the amorphous silicon film 107 is set to $1 \times 10^{19}$ to $1 \times 10^{21}$ atoms $cm^{-3}$. Also, the reason why the amorphous silicon film 107 has oxygen contained with a high concentration is because the amorphous silicon film is restrained from being crystallized by heating in a subsequent gettering process.

After the formation of the amorphous silicon film 107, a heat treatment is conducted with the result that the nickel elements in the crystalline silicon film 105 are diffused in the amorphous silicon film 107 so that the concentration of nickel elements in the crystalline silicon film 105 can be lowered.

This is because a large number of defects or the like caused by the film quality of amorphous, and a large number of defects caused by oxide represented by oxygen or $SiO_x$ exist as elements of gettering nickel in the amorphous silicon film 107.

The above gettering effect can be more obtained as the heating temperature is high. The lower limit of the heating temperature is defined by a temperature at which nickel can be diffused, and the upper limit of the heating temperature is defined by a temperature at which the amorphous silicon film 107 is not crystallized and the strain point or lower of the substrate. In the actual process, the heat treatment may be conducted at 550 to 1,050° C. with the above conditions being satisfied. In this embodiment, the heat treatment is conducted at 600° C. for 4 hours.

The amorphous silicon is caused to be crystallized at a temperature of about 450° C. However, in this embodiment, since the amorphous silicon film 107 contains oxygen with a high concentration, for example, $10^{19}$ to $10^{21}$ atoms $cm^{-3}$, oxygen prevents the amorphous silicon film from being crystallized, and even though the heat treatment is implemented within the above range, the amorphous silicon film 107 can be kept amorphous. Alternatively, the amorphous silicon film 107 is not completely crystallized. Hence, even after the heat treatment has been conducted, the crystalline silicon film 105 and the amorphous silicon film 107 can be made different in quality from each other.

Furthermore, with the application of the heat treatment for a long period of time, the concentration of nickel in the crystalline silicon film 105 can be more lowered although it is gradual. This action is a remarkable characteristic which cannot be found in the case where the amorphous silicon film is crystallized.

Subsequently, as shown in FIG. 1D, the amorphous silicon film 107 is removed by etching. A difference in crystal structure between the amorphous silicon film 107 and the crystalline silicon film 105 enables only the amorphous silicon film 107 to be readily removed. In particular, as an etchant and etching gas, what is high in the etching select ratio of the amorphous silicon film to the crystalline silicon film is preferably used. In this embodiment, as the etchant of the amorphous silicon film 107, hydrazine ($N_2H_6$) is used. This is because hydrazine is higher in etching rate of the amorphous silicon film than the etching rate of the crystalline silicon film.

Through the above etching process, the crystalline silicon film 108 which could lower the content concentration of nickel elements is obtained. The concentration of nickel elements in the crystalline silicon film 108 finally obtained can be more reduced as the thickness of the amorphous silicon film 107 that allows nickel to be diffused is thick. In other words, the volume of the amorphous silicon film 107 is increased in comparison with the volume of the crystalline silicon film 105, thereby being capable of diffusing a larger amount of nickel in the amorphous silicon film 107.

In this embodiment, the crystalline silicon film 105 is made identical in thickness with the amorphous silicon film 107. According to the results of measuring the distribution of the concentration of nickel elements in the crystalline silicon film 108 through SIMS, the maximum value of the concentration was $3 \times 10^{18}$ atoms $cm^{-3}$. In other words, after crystallization, as shown in FIG. 11, nickel of about $5 \times 10^{18}$ atoms $cm^{-3}$ at the largest exists in the crystalline silicon film 105, but the mean concentration of nickel elements in the crystalline silicon film 108 can be set to ½ or less by diffusing nickel elements in the amorphous silicon film 107.

In this embodiment, oxygen is contained as the impurities in the amorphous silicon film 107, but even though carbon or nitrogen is contained therein instead of oxygen, the same effect can be obtained. In the amorphous silicon film 107, for example, the concentration of carbon and nitrogen may be set to $1 \times 10^{19}$ to $1 \times 10^{20}$ atoms $cm^{-3}$. Also, not only one kind of element but also plural kinds of elements selected from oxygen, carbon and nitrogen may be contained in the amorphous silicon film 107.

(Second Embodiment)

A second embodiment which is a modified example of the first embodiment is to form a protective film that functions as an etching stopper in removing an amorphous silicon film for allowing metal elements such as nickel to be diffused. FIG. 2 shows a process for manufacturing a crystalline silicon film in accordance with the second embodiment.

Figure 2A:
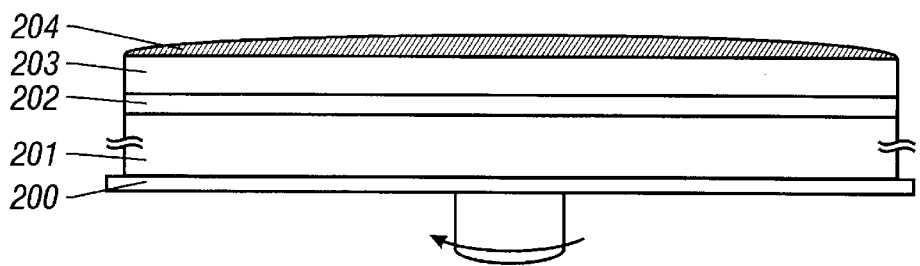
FIGS. 2A to 2D are diagrams showing a process of manufacturing a crystalline silicon film in accordance with a second embodiment of the present invention.

As shown in FIG. 2A, a silicon oxynitride film is formed in thickness of 3,000 Å on a glass substrate 201 (Corning 1737, a strain point 667° C.) as an underlayer film 202 as in the first embodiment. The underlayer film 202 is disposed to prevent impurities or alkali ions from being diffused from the glass substrate 201 into a semiconductor thin film which will be formed later. Then, an amorphous silicon film 203 is formed in thickness of 600 Å through the plasma CVD method or the low pressure thermal CVD method.

Thereafter, a nickel acetate solution adjusted to a predetermined concentration of nickel drops on the amorphous silicon film 203 to form a water film 204. Then, spin coating is conducted using a spinner 200 so that the nickel elements are held in contact with the surface of the amorphous silicon film 203 (FIG. 2A).

Figure 2B:
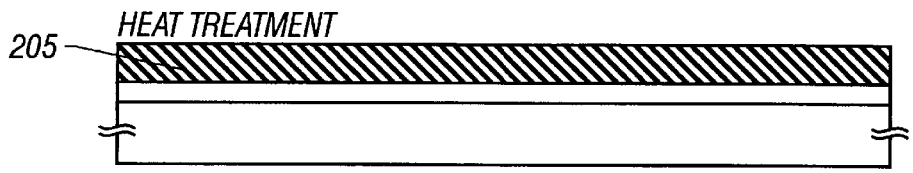

Subsequently, as shown in FIG. 2B, the heat treatment is conducted at 620° C. for 4 hours as in the first embodiment, to thereby obtain a crystalline silicon film 205. The crystal growth is the vertical growth which is disorderly progressed in a direction substantially perpendicular to the substrate toward the underlayer film 202.

After the crystalline silicon film 205 has been obtained, a silicon oxide film 206 is formed on the surface of the crystalline silicon film 205. The thickness of the silicon oxide film 206 may be set to about several tens to 100 Å. The reason why the film is thinned is because the nickel elements in the crystalline silicon film 205 need to be movable through the silicon oxide film 206. In this example, the very thin silicon oxide film 206 is formed by the irradiation of UV rays in the air. It was proved that even if the silicon oxide film 206 is a very thin film to such an extent as a natural oxide film, it has the effect as the etching stopper in etching the amorphous silicon film (indicated by reference numeral 207) which will be conducted later.

In this example, the silicon oxide film 206 is formed using the UV oxidizing method, however, the film 206 may be formed through the heat oxidizing method. Also, since the silicon oxide film 206 functions as the etching stopper in a subsequent etching process, the film 206 may be a film which can obtain the selectivity in etching the crystalline silicon film 205. For example, a very thin silicon nitride film or silicon oxynitride film may be used instead of the silicon oxide film 206.

Then, an amorphous silicon film 207 containing oxygen as impurities is formed in thickness of 600 Å through the plasma CVD method or the low pressure thermal CVD method. In this embodiment, the concentration of oxygen in the amorphous silicon film 207 is set to $1\times10^{19}$ to $1\times10^{21}$ atoms cm$^{-3}$. Also, carbon or nitrogen may be contained with the concentration of about $1\times10^{17}$ to $1\times10^{20}$ atoms cm$^{-3}$ instead of oxygen.

Figure 2C:
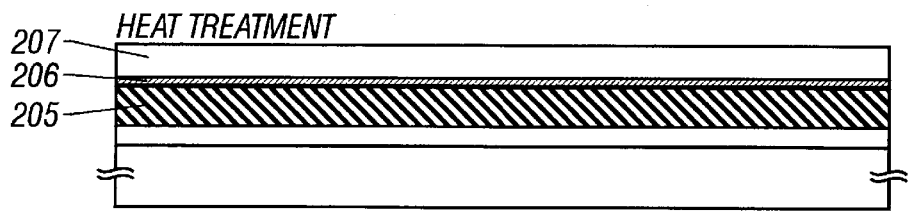

Subsequently, as shown in FIG. 2C, a heat treatment is conducted. As a result, the nickel elements in the crystalline silicon film 205 are diffused in the amorphous silicon film 207 through the oxide film 206, thereby being capable of lowering the concentration of nickel elements in the crystalline silicon film 205. In this embodiment, the heat treatment is conducted at a temperature of 600° C. for 4 hours as in the first embodiment.

The amorphous silicon is allowed to be crystallized at a temperature of about 450° C. However, in this embodiment, since the amorphous silicon film 207 contains oxygen with a high concentration, for example, $10^{19}$ to $10^{21}$ atoms cm$^{-3}$, oxygen prevents the amorphous silicon film from being crystallized, and even though the heat treatment is implemented within the above range of temperature, the amorphous silicon film 207 can be kept amorphous. Alternatively, the amorphous silicon film 207 is not perfectly crystallized. Hence, even after the heat treatment has been conducted, the crystalline silicon film 205 and the amorphous silicon film 207 can be made different in quality from each other.

Figure 2D:

Then, as shown in FIG. 2D, the amorphous silicon film 207 is removed. In this embodiment, as the etchant of the amorphous silicon film 207, hydrazine (N$_2$H$_6$) is used to conduct wet etching. In case of using hydrazine as the etchant, etching rate of the amorphous silicon film is higher than the etching rate of the crystalline silicon film.

Further, in this embodiment, because the silicon oxide film 206 which is not etched with hydrazine (its etching rate is very low, and it can be considered that etching is not conducted) is formed on the crystalline silicon film 205 as an etching stopper, the amorphous silicon film 207 can be readily selectively removed, and over-etching can be also suppressed, resulting in an excellent reproducibility. It should be noted that amorphous silicon film 207 can be also removed by dry etching with ClF$_3$ gas.

Then, the silicon oxide film 206 is removed by buffer hydrofluoric acid or fluorine nitrate, to thereby obtain a crystalline silicon film 208 that enabled the content concentration of nickel elements to be lowered as shown in FIG. 2D. Although the nickel elements of about $5\times10^{18}$ are, as shown in FIG. 11, contained in the crystalline silicon film 205, in the case where the crystalline silicon film 205 and the amorphous silicon film 207 are made identical in thickness with each other, the concentration of nickel elements in the crystalline silicon film 208 finally obtained can be set to about $3\times10^{18}$ or less, that is, ½ or less in average, with the gettering process of this embodiment.

(Third Embodiment)

A third embodiment, in order to implement a process of diffusing metal elements at a temperature as high as possible, allows an amorphous silicon film containing impurities therein to be crystallized in the diffusion process, although the metal elements are diffused at a temperature where the amorphous silicon film is prevented from being crystallized in the second embodiment.

FIG. 3 shows a process of manufacturing a crystalline silicon film in accordance with this embodiment.

First, as shown in FIG. 3A, an underlayer film 302 is formed on a Corning 1737 glass substrate 301 (a strain point 667° C.) in order to prevent impurities or alkali ions from being diffused from the glass substrate 301 into a semiconductor thin film which will be formed later. In this embodiment, a silicon oxynitride film is formed as the underlayer film 302.

Then, an amorphous silicon film 303 is formed in thickness of 600 Å through the low pressure thermal CVD method.

After the amorphous silicon film 303 has been formed, a nickel acetate solution adjusted to a predetermined concentration of nickel drops on the amorphous silicon film 303 to form a water film 304. Then, spin coating is conducted using a spinner so that the nickel elements are held in contact with the surface of the amorphous silicon film 303 in the water film 304 (FIG. 3A).

Subsequently, as shown in FIG. 3B, the heat treatment is conducted at a temperature of 450 to 650° C. which is a strain point or lower of the glass substrate to crystallize the amorphous silicon film 303, thus obtaining a crystalline silicon film 305. In this embodiment, the heat treatment is conducted at 620° C. for 4 hours. The crystal growth is the vertical growth.

After the crystalline silicon film 305 is thus obtained, as shown in FIG. 3C, a silicon oxide film 306 that functions as an etching stopper is formed in thickness of several tens to 100 Å by irradiation of UV rays on the surface of the crystalline silicon film 305 in the air.

Thereafter, an amorphous silicon film 307 containing oxygen as impurities therein is formed in thickness of 600 Å through the low pressure thermal CVD method. In this state, the concentration of nickel elements obtained through SIMS was about $5 \times 10^{18}$ atoms $cm^{-3}$ at the maximum in the crystalline silicon film 305, and was lower than a measurement limit ($1 \times 10^{17}$ atoms $cm^{-3}$) of SIMS in the amorphous silicon film 307.

In this embodiment, in order to capture more nickel elements into the amorphous silicon film 307, taking the concentration of nickel elements in the crystalline silicon film 305 into consideration, the concentration of oxygen in the amorphous silicon film 307 is set to $1 \times 10^{19}$ to $1 \times 10^{21}$ atoms $cm^{-3}$.

After the formation of the amorphous silicon film 307, as shown in FIG. 3D, a heat treatment is conducted. As a result, because the nickel elements in the crystalline silicon film 305 are diffused in the amorphous silicon film 307 through the oxide film 306, the concentration of the nickel elements in the crystalline silicon film 305 can be lowered.

Because the above process is made to diffuse nickel outside of the crystalline silicon film 305, the lower limit of the heating temperature is defined by a temperature at which nickel can be diffused. Also, because the above gettering effect can be more obtained as the heating temperature is high, it is preferable that heating is conducted at a temperature as high as possible. Hence, the upper limit of the heating temperature is defined by the strain point or lower of the substrate. In the actual process, the heat treatment may be conducted at 550 to 1,050° C. with the above conditions being satisfied. In this embodiment, the heat treatment is conducted at 620° C. for 2 hours, taking the heat resistance of the glass substrate into consideration.

In this embodiment, because the heating temperature is set as high as possible, the amorphous silicon film 307 is caused to be crystallized due to the catalytic action of the nickel elements which are diffused from the crystalline silicon film 305 with the result that the amorphous silicon film is formed into a crystalline silicon film. However, because the crystalline silicon film 307 contains oxygen with a high concentration such as $10^{19}$ to $10^{21}$ atoms $cm^{-3}$, a large number of defects are formed inside of the crystalline silicon film 307 due to oxygen elements and act as a gettering sink.

The crystalline silicon film 308 containing the nickel elements with a high concentration therein is removed by wet etching or dry etching.

In order to remove the crystalline silicon film 308, as an etchant and etching gas, what is high in the etching select ratio of the silicon film to the oxide film is used. For example, hydrazine ($N_2H_6$) may be used as the etchant, and $ClF_3$ gas may be used as the etching gas. In this situation, the silicon oxide film 306 on the crystalline silicon film 305 functions as an etching stopper.

Further, because the crystalline silicon film 308 contains oxygen with a high concentration such as $10^{19}$ to $10^{21}$ atoms $cm^{-3}$, the quality of the crystalline silicon film 305 is different from that of the crystalline silicon film 308 through the silicon oxide film 306. For that reason, in this embodiment, only the crystalline silicon film 308 can be surely removed.

Subsequently, the silicon oxide film 306 is removed by buffer hydrofluoric acid or fluorine nitrate, to thereby obtain a crystalline silicon film 309 that enabled the content concentration of nickel elements to be lowered as shown in FIG. 3E. The concentration of nickel elements in the crystalline silicon film 309 finally obtained can be more reduced as the amorphous silicon film 307 into which nickel is diffused is thick.

In this embodiment, the crystalline silicon film 305 was substantially identical in thickness with the amorphous silicon film 307. According to the results of measuring the distribution of the concentration of nickel elements in the crystalline silicon film 309 through SIMS, the maximum value of the concentration was $3 \times 10^{18}$ atoms $cm^{-3}$. In other words, after crystallization, as shown in FIG. 7, nickel of about $5 \times 10^{18}$ atoms $cm^{-3}$ at the largest exists in the crystalline silicon film 305, but the mean concentration of nickel elements in the crystalline silicon film 305 can be set to ½ or less by diffusing the nickel elements in the amorphous silicon film 308.

(Fourth Embodiment)

Figure 4A:
FIGS. 4A to 4D are diagrams showing a process of manufacturing a thin-film transistor in accordance with a fourth embodiment of the present invention.

A fourth embodiment represents a process of manufacturing a thin-film transistor using a crystalline silicon film which has grown vertically and has been obtained through the manufacturing method described in the first to third embodiments. FIG. 4 shows a process for manufacturing a thin-film transistor in accordance with this embodiment. First, a crystalline silicon film 403 is formed on a glass substrate 401 on which an underlayer film 402 has been formed using the method described in the first to third embodiments (FIG. 4A).

Figure 4B:
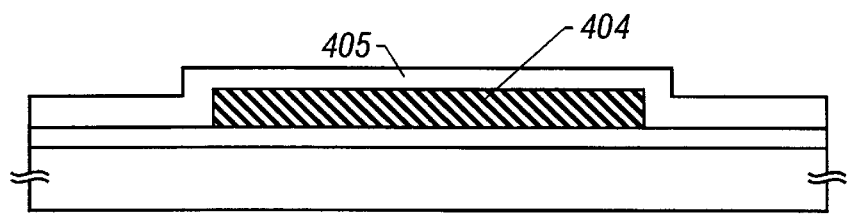

Subsequently, the crystalline silicon film 403 thus obtained is patterned to form an active layer of the thin-film transistor. Then, a silicon oxide film 405 that functions as a gate insulating film is formed in thickness of 1,000 Å through the plasma CVD method or the low pressure thermal CVD method (FIG. 4B).

Thereafter, an aluminum film containing scandium therein is formed in thickness of 6,000 Å and then patterned, to thereby form a gate electrode indicated by reference numeral 406. Then, anodization is conducted with the gate electrode 406 as an anode in electrolyte, to thereby form an oxide layer 407. The oxide layer 407 is set to 2,000 Å in thickness. The thickness of the oxide layer 407 enables an offset region to be formed in a post-process.

Further, impurity ions are injected into the active layer 404. In this example, phosphorus ions are injected as the impurity ions. During this process, the phosphorus ions are injected into regions 408 and 411. These regions 408 and 411 form source/drain regions. A region 409 forms an offset gate region. A region 410 forms a channel formation region.

Figure 4C:
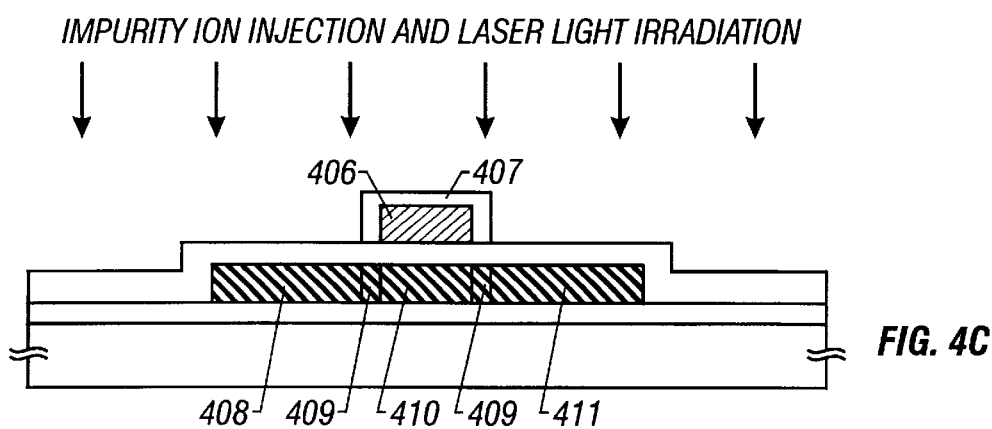

After the injection of the impurity ions has been completed, a laser light is irradiated onto those regions to activate injected ions and to anneal the source/drain regions 408 and 411 which have been damaged during the injection of ions (FIG. 4C).

Figure 4D:
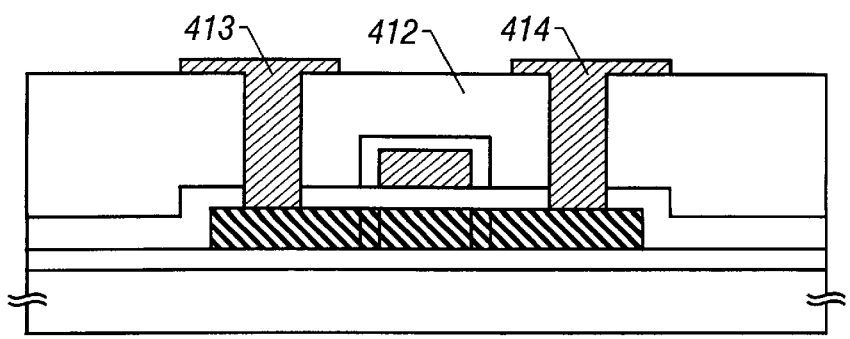

Subsequently, a silicon oxide film 412 is formed as an interlayer insulating film, contact holes are formed, and a source electrode 413 and a drain electrode 414 are formed using aluminum. Finally, a heat treatment is conducted in a hydrogen atmosphere at 350° C. to complete a thin-film transistor (FIG. 4D).

(Fifth Embodiment)

A fifth embodiment relates to a technique by which nickel as metal elements that promote the crystallization of silicon is selectively introduced to obtain a crystalline silicon film whose crystal has grown in a direction parallel to a substrate while the concentration of nickel in the crystalline silicon film is lowered.

As shown in FIG. 5, a silicon oxynitride film is formed in thickness of 3,000 Å on a glass substrate (Corning 1737) 501 as an underlayer film 502 through the sputtering method. Then, an amorphous silicon film 503 is formed in thickness of 500 Å through the plasma CVD method or the low pressure thermal CVD method. Thereafter, UV rays are irradiated onto the amorphous silicon film 503 in an oxygen atmosphere to form a very thin oxide film (not shown) on the surface of the amorphous silicon film 503. The oxide film 503 is disposed to improve the wettability of solution during a subsequent solution coating process.

Then, a mask 504 is formed using a resist 504. A region 505 exposed from the resist 504 is slit-shaped in a longitudinal direction vertical to the paper surface.

Figure 5A:
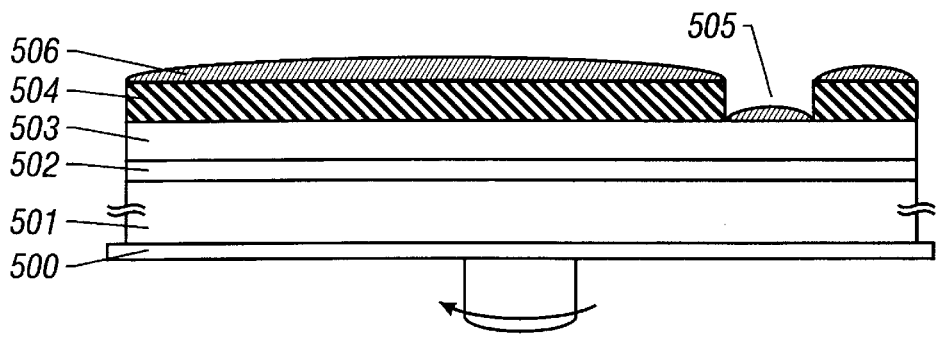
FIGS. 5A to 5D are diagrams showing a process of manufacturing a crystalline silicon film in accordance with a fifth embodiment of the present invention.
Figure 5B:
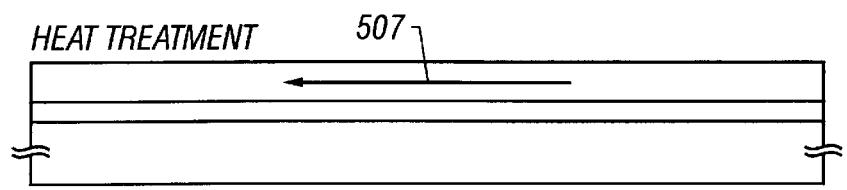
Figure 5C:
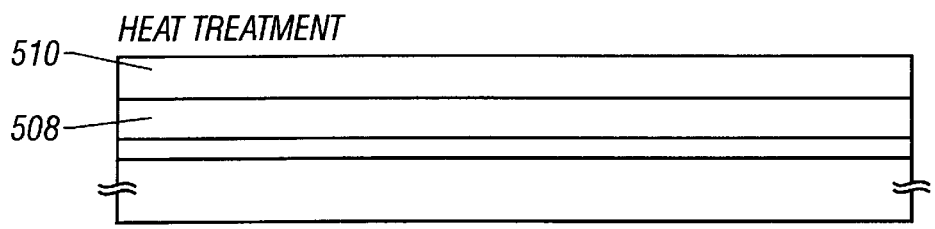

Subsequently, a nickel acetate solution adjusted to a predetermined concentration of nickel drops on the amorphous silicon film 503 to form a water film 506 (FIG. 5A). Further, spin coating is conducted using a spinner 500 so that the nickel elements in the water film 506 are held in contact with the region 505 on the amorphous silicon film 503 through the oxide film not shown. Then, as shown in FIG. 5B, the resist mask 504 is removed.

Subsequently, a heat treatment is conducted in a nitrogen atmosphere containing hydrogen 3% at 620° C. for 4 hours to crystalize the amorphous silicon film 503. The nickel elements are diffused into the amorphous silicon film 503 through the oxide film not shown from a state in which the nickel elements are held in contact with the region 505 through the oxide film not shown. With the diffusion of the nickel elements, crystal growth is progressed in a direction parallel to the substrate as indicated by an arrow 507, to thereby form a crystalline silicon film 508.

The crystal growth is progressed in the form of a column or needle. In this embodiment, since the region 505 is slit-shaped along a longitudinal direction from the front of the drawing toward the back thereof, the crystal growth indicated by the arrow 507 is progressed along substantially one direction. In this specification, the crystal growth in parallel to the substrate is called "lateral growth". The lateral growth can be performed over several tens to 100 μm or more (FIG. 5B).

In the amorphous silicon film 503, the crystal growth is the above vertical growth in a region exposed by an opening 505. Hence, a lateral-growth region, a vertical-growth region and an amorphous silicon region where crystallization has not been progressed exist in the crystalline silicon film 508.

Because catalytic elements such as nickel have a tendency to concentrate on the tip portion of the crystal growth, the concentration of the nickel elements is high in the end portion of the lateral growth, that is, an interface between the lateral-growth region and the amorphous silicon region, and the vertical growth region in the crystalline silicon film 508. Hence, the concentration of the nickel elements in the lateral-growth region is lower than the vertical-growth region, and further is low in comparison with that of the crystalline silicon film which has grown vertically in the first to third embodiments.

This embodiment is made to further lower the concentration of the nickel elements in the lateral-growth region.

After the crystalline silicon film 508 has been obtained, an amorphous silicon film 510 containing oxygen therein is formed in thickness of 1,000 Å through the plasma CVD method and the low pressure CVD method. It should be noted that the amorphous silicon film 510 is formed so that the concentration of oxygen in the amorphous silicon film 510 becomes $1 \times 10^{19}$ to $1 \times 10^{21}$ atoms cm$^{-3}$.

Then, a heat treatment is conducted at 600° C. for 4 hours, and the nickel elements in the crystalline silicon film 508 are diffused in the amorphous silicon film 510 through the oxide film 509.

Figure 5D:

Thereafter, the amorphous silicon film 510 is etched with $ClF_3$ gas and removed. In this way, a crystalline silicon film 511 having the concentration of nickel lowered as shown in FIG. 5D can be obtained. The crystalline silicon film 511 is characterized in that it has the lateral-growth region and the concentration of nickel in the film is low.

It has been proved from the experiment that a distance of the lateral-growth region can be extended more as the amount of nickel introduced in the region 505 is increased to some degree. However, since an increase in the amount of introduced nickel elements causes a factor of heightening the concentration of nickel in the crystalline silicon film 511 finally obtained, it is not preferable. As the concentration of nickel in the film is heightened ($5 \times 10^{19}$ atoms cm$^{-3}$ or higher), problems such that the semiconductor characteristics of the silicon film are lost, the operation of the thin-film transistor as manufactured becomes unstable, and the characteristics are remarkably deteriorated are actualized.

However, as described in this embodiment, the removal of the nickel elements after the crystallization due to the lateral growth has been completed can satisfy both of a demand for extending the distance of the crystal growth laterally, and a demand for lowering the concentration of nickel (concentration of metal elements) particularly in the lateral-growth region of the crystalline silicon film 511 as obtained as much as possible.

(Sixth Embodiment)

In the fifth embodiment, after the crystalline silicon film which has grown laterally is obtained, the amorphous silicon film into which nickel is diffused is restrained from being crystallized in lowering the concentration of nickel. In a sixth embodiment, the process for diffusing nickel is implemented at a temperature as high as possible, to thereby crystallize the amorphous silicon film.

Figure 6A:
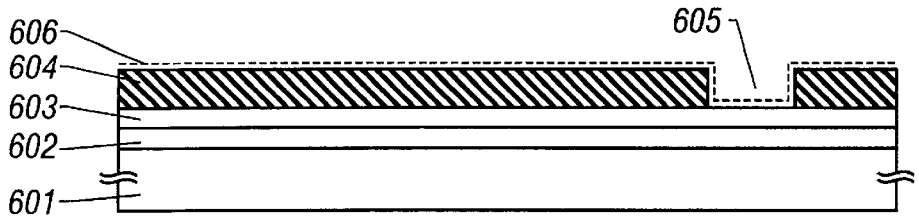
FIGS. 6A to 6E are diagrams showing a process of manufacturing a crystalline silicon film in accordance with a sixth embodiment of the present invention.

As shown in FIG. 6A, a silicon oxynitride film is formed in thickness of 3,000 Å on a glass substrate (Corning 1737) 601 as an underlayer film 602 through the sputtering method. Then, an amorphous silicon film 603 is formed in thickness of 500 Å through the plasma CVD method or the low pressure thermal CVD method. Thereafter, UV rays are irradiated onto the amorphous silicon film 603 in an oxygen atmosphere to form a very thin oxide film (not shown) on the surface of the amorphous silicon film 603. The oxide film is disposed to improve the wettability of solution during a subsequent solution coating process.

Then, a silicon oxide film is formed in thickness of 1,500 Å, and further a mask 604 with a slit-shaped opening 605 having a longitudinal direction in a direction perpendicular to the paper surface is formed. It is proper that the width of the opening 605 is set to 20 μm or more. The length of the opening 605 along the longitudinal direction may be arbitrarily determined.

Subsequently, a nickel acetate solution containing nickel of a predetermined concentration drops on the amorphous silicon film 603 to form a water film 606. Further, spin coating is conducted using a spinner so that the nickel elements are held in contact with the amorphous silicon film 603 exposed at the opening 605 through the oxide film not shown.

Figure 6B:
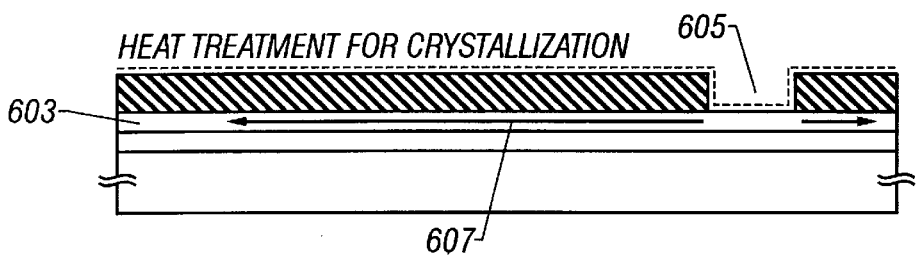

Then, as shown in FIG. 6B, a heat treatment is conducted for 4 hours to crystallize the amorphous silicon film 603. In the amorphous silicon film 603, nickel elements are diffused into the amorphous silicon film 603 through the oxide film not shown from the region exposed at the opening 605. With the diffusion of the nickel elements, in the amorphous silicon film 603, the crystal growth is progressed in a direction parallel to the substrate as indicated by an arrow 607, to thereby form a crystalline silicon film 608. Hence, a lateral-growth region, a vertical-growth region and an amorphous silicon region where crystallization has not been progressed exist in the crystalline silicon film 608.

Because catalytic elements such as nickel have a tendency to concentrate on the tip portion of the crystal growth, the concentration of the nickel elements is high in the end portion of the lateral growth, that is, an interface between the lateral-growth region and the amorphous silicon region, and the vertical growth region in the crystalline silicon film 608. Hence, the concentration of the nickel elements in the lateral-growth region is lower than the vertical-growth region, and further is low in comparison with that of the crystalline silicon film which has grown vertically in the first to third embodiments.

Figure 6C:
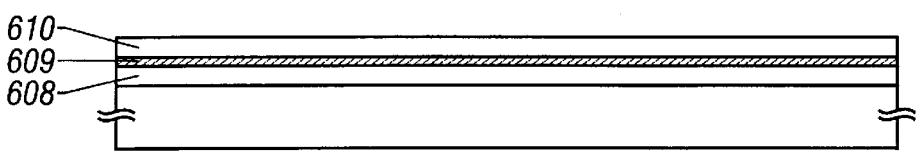

After the crystalline silicon film 608 is obtained and the mask 604 formed of the silicon oxide film is removed, a silicon oxide film 609 is formed in thickness of about several tens to 100 Å on the surface of the crystalline silicon film 608 as a protective film that functions as an etching stopper through the heat oxidizing method, as shown in FIG. 6C.

Thereafter, an amorphous silicon film 610 containing oxygen as impurities therein is formed in thickness of 600 Å through the plasma CVD method or the low pressure thermal CVD method.

Figure 6D:
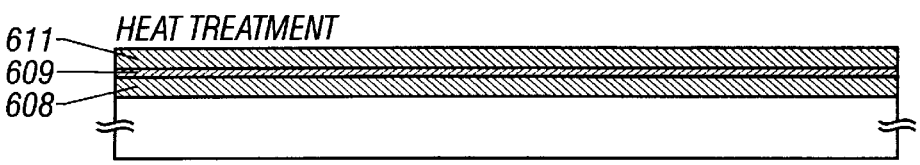
Figure 6E:
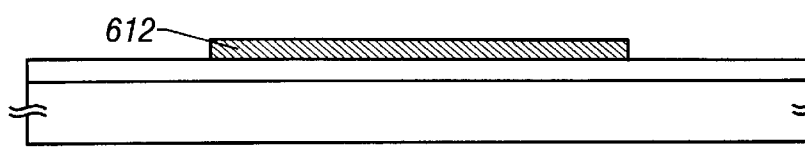

After the amorphous silicon film 610 has been formed, a heat treatment is conducted as shown in FIG. 6D. Since gettering becomes higher as the heating temperature is high, in this embodiment, the heat treatment is conducted at a temperature of 620° C. for 2 hours, taking the heat resistance of the glass substrate into consideration, as in the third embodiment.

Because the films are heated at 620° C., with the diffusion of the nickel elements into the amorphous silicon film 610, the amorphous silicon film 610 is crystallized into a crystalline silicon film 611. However, oxygen with a high concentration such as $10^{19}$ to $10^{21}$ atoms cm$^{-3}$ exists in the crystalline silicon film 611, and oxygen allows a large number of defects to be formed. Hence, because those defects act as a gettering sink, the nickel elements are diffused into the amorphous silicon film 610 through the silicon oxide film 609, thereby being capable of lowering the concentration of the nickel elements in the crystalline silicon film 608.

Thereafter, the crystalline silicon film 611 containing the nickel elements with a high concentration therein is removed by etching using hydrazine (N$_2$H$_6$) or ClF$_3$ gas, with the silicon oxide film 609 as an etching stopper.

Then, after the removal of the crystalline silicon film 611, the silicon oxide film 609 is removed by buffer hydrofluoric acid or fluorine nitrate, to thereby obtain a crystalline silicon film that enables the content concentration of the nickel elements to be lowered. An island-like region 612 is formed by patterning the crystalline silicon film. The island-like region 612 is so designed as to include only the lateral-growth region, but to exclude the end portion of the lateral growth where nickel exists with a high concentration, the vertical-growth region, and the amorphous region different in electric characteristics.

In the crystallization of the lateral-growth region, the concentration of the nickel elements is relatively lower than that of other regions. However, in this embodiment, because the concentration of the nickel elements is further lowered during the gettering process shown in FIG. 6D, the concentration of the nickel elements in the island-like region 612 consisting of only the lateral-growth region can be set to the order of about $10^{17}$ atoms cm$^{-3}$. The thin-film transistor using such an island-like region 612 is higher in mobility than the thin-film transistor using the crystalline silicon film 309 which has grown vertically in the third embodiment.

Also, in this embodiment, because the silicon oxide film 609 that functions as an etching stopper is formed, only the silicon film into which the metal elements are diffused can be removed regardless of its crystalline state. Hence, the heating temperature in the process of diffusing the nickel shown in FIG. 6D may be set to a temperature at which the concentration of the nickel elements in the crystalline silicon film 608 can be reduced to a desired value, regardless of whether the amorphous silicon film 610 into which the metal elements are diffused is crystallized, or not.

(Seventh Embodiment)

A seventh embodiment shows an example of constituting a thin-film transistor using the crystalline silicon film obtained in the fifth and sixth embodiments. FIG. 7 shows a manufacturing process in accordance with this embodiment.

A crystalline silicon film is obtained in accordance with processes shown in FIGS. 5 and 6.

Figure 7A:
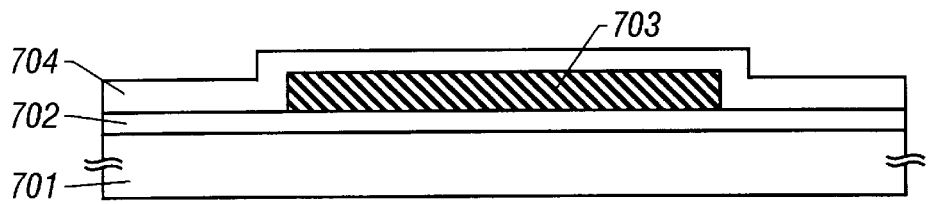
FIGS. 7A to 7C are diagrams showing a process of manufacturing a thin-film transistor in accordance with a seventh embodiment of the present invention.

As shown in FIG. 7A, the crystalline silicon film is patterned to form a region which will constitute an active layer 703 of a thin-film transistor. In FIG. 7A, reference numeral 701 denotes a glass substrate, and reference numeral 702 is a silicon oxide film which is an under layer.

The crystalline silicon film has a lateral-growth region, a vertical-growth region and an amorphous region. However if the active layer 703 is formed of only the lateral-growth region, a higher-quality thin-film transistor can be manufactured. It is important that the start point of the crystal growth (a region into which nickel is introduced) and the end point of the crystal growth are prevented from existing within the active layer 703. This is because nickel of a high concentration is contained in the start point of the crystal growth and the end point of the crystal growth.

Further, a silicon oxide film 704 that functions as a gate insulating film is formed in thickness of 1,000 Å through the plasma CVD method (FIG. 7A).

Figure 7B:
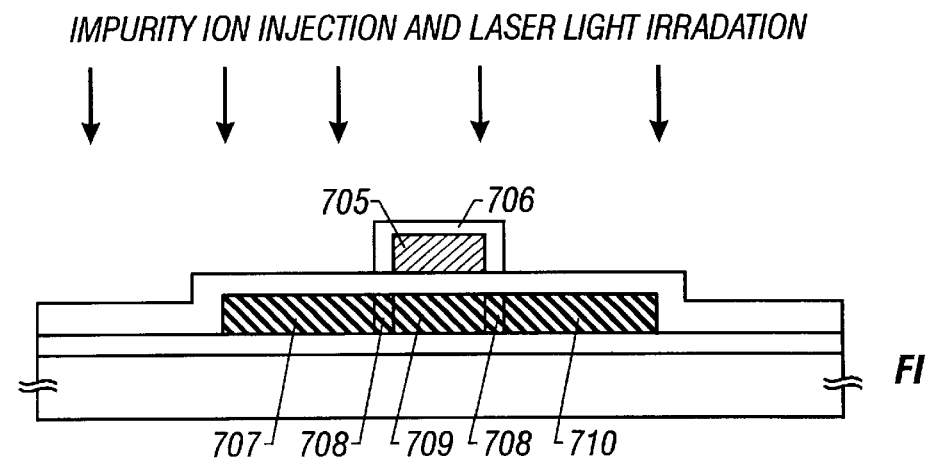

Then, a film which is mainly made of aluminum is formed and patterned to form a gate electrode 705. Anodization is conducted on the film in an electrolyte with the gate electrode 705 as an anode to form an oxide layer 706. The thickness of the oxide layer 706 enables an offset gate region 708 to be formed in a post-process of injecting impurity ions (FIG. 7B).

Phosphorus ions are injected into the surface of the film as impurity ions. In this process, a source region 707 and a drain region 710 are formed. Furthermore, the offset gate region 708 and a channel formation region 709 are formed. After the implantation of the impurity ions has been completed, the source/drain regions 707 and 710 are activated by irradiation of a laser light or an intense light.

Figure 7C:
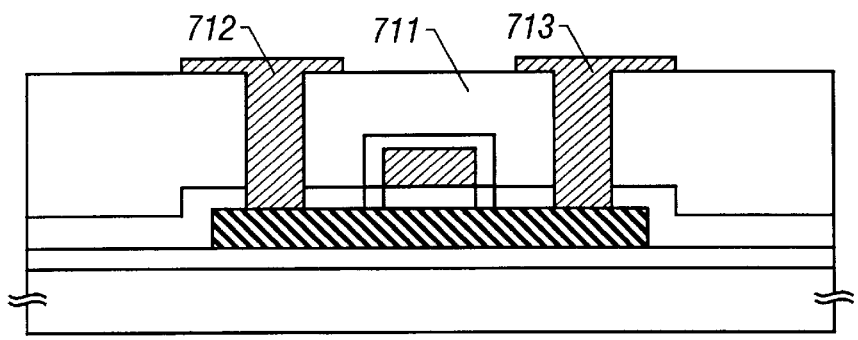

Then, a silicon oxide film 711 which will constitute an interlayer insulating film is formed in thickness of 6000 Å through the plasma CVD method. After contact holes have been formed in the silicon oxide film 711, a source electrode 712 and a drain electrode 713 are formed. In the above manner, a thin-film transistor is completed (FIG. 7C).

(Eighth Embodiment)

An eighth embodiment is characterized in that a heat treatment is again conducted after the process of manufacturing the crystalline silicon film in the first to third embodiments shown in FIGS. 1 to 3. In other words, this embodiment is characterized by improving the characteristics of the crystalline silicon film that has grown vertically.

For example, if a heat treatment is conducted in the process shown in FIG. 1C, nickel (metal elements) in the crystalline silicon film 105 is gradually drawn out in the amorphous silicon film 107. In this situation, the concentration of nickel in the vicinity of the surface of the crystalline silicon film 105 is caused to be higher than that in the vicinity of the interface of the silicon oxide film 102 under the crystalline silicon film 105. This means that the nickel elements are caused to be segregated on the side of the surface of the crystalline silicon film 105 as a result that nickel in the crystalline silicon film 105 is drawn out in the amorphous silicon film 107.

For that reason, in case of manufacturing the thin-film transistor using the crystalline silicon film 108 formed on the glass substrate 101 as shown in FIG. 1D, carriers are transmitted on the surface of the crystalline silicon film 108. It is not preferable that nickel with a high concentration exists in a region where the carriers are transmitted.

In view of the above, in this embodiment, as shown in FIG. 1D, after the silicon film which was formed on the surface of the crystalline silicon film and into which the metal films is removed, a heat treatment is conducted to again diffuse nickel in the crystalline silicon film 108. Since the heat treatment conducted in this process is sufficient to diffuse nickel, the heating temperature may be 400° C. or higher. Also, the upper limit of the heating temperature is limited by the heat resistance of the glass substrate. Hence, the heating temperature in this process may be 400° C. or higher, but lower than that of the strain point of the glass substrate.

Hereinafter, this embodiment will be described in detail with reference to FIG. 8.

Figure 8A:
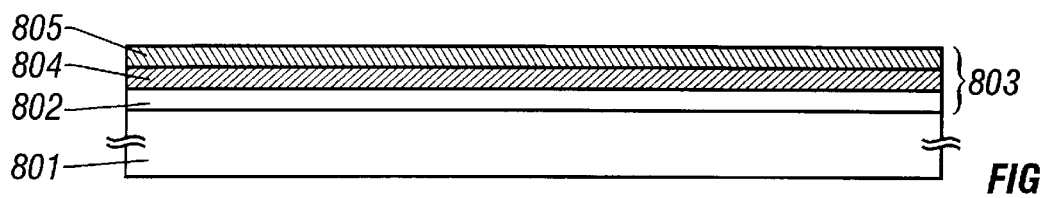
FIGS. 8A to 8C are diagrams showing a process of manufacturing a crystalline silicon film in accordance with an eighth embodiment of the present invention.

Through the manufacturing process shown in FIGS. 1 to 3, a crystalline silicon film which has grown vertically is obtained. This state is shown in FIG. 8A. A crystalline silicon film 803 is formed on a glass substrate 801 through an underlayer film 802. The crystalline silicon film 803 consists of a layer 805 (a front surface side) in which nickel is segregated and nickel is contained with a high concentration, and a layer 804 in which nickel is contained with a concentration lower than that in the layer 805.

Figure 8B:
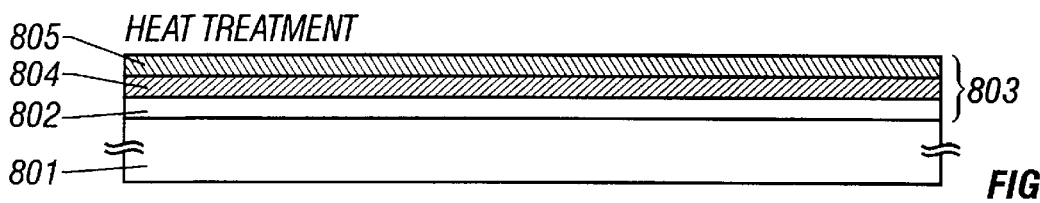
Figure 8C:
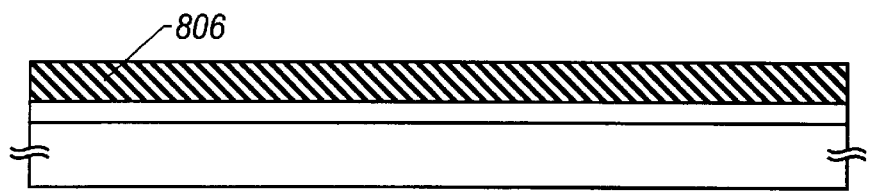

In the state shown in FIG. 8A, a heat treatment is conducted on the crystalline silicon film 803 as shown in FIG. 8B. As a result, the nickel elements in the region 805 are diffused in the region 804 in which nickel exists with a lower concentration. In this manner, the layer 805 is lowered in the concentration of nickel, and the crystalline silicon film 803 can be made in a state where nickel is not segregated as a whole. Thus, a crystalline silicon film 806 having its surface lowered in the concentration of nickel can be obtained (FIG. 8C).

(Ninth Embodiment)

A ninth embodiment shows an example in which the irradiation of a laser light is conducted instead of a heat treatment in a crystallization process. The process according to this embodiment is shown in FIG. 9.

Figure 9A:
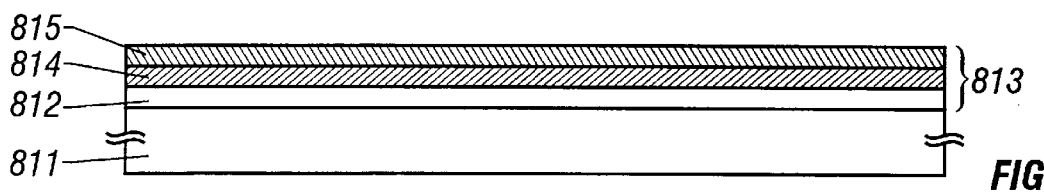
FIGS. 9A to 9C are diagrams showing a process of manufacturing a crystalline silicon film in accordance with a ninth embodiment of the present invention.

First, through the process shown in FIG. 1 or 3, a crystalline silicon film 815 which has grown vertically is obtained on a glass substrate. This state is shown in FIG. 9A. A crystalline silicon film 813 is formed on a glass substrate 811 through an underlayer film 812. The crystalline silicon film 813 consists of a layer 815 (a front surface side) in which nickel is segregated and nickel is contained with a high concentration, and a layer 814 in which nickel is contained with a concentration lower than that in the layer 815.

Figure 9B:
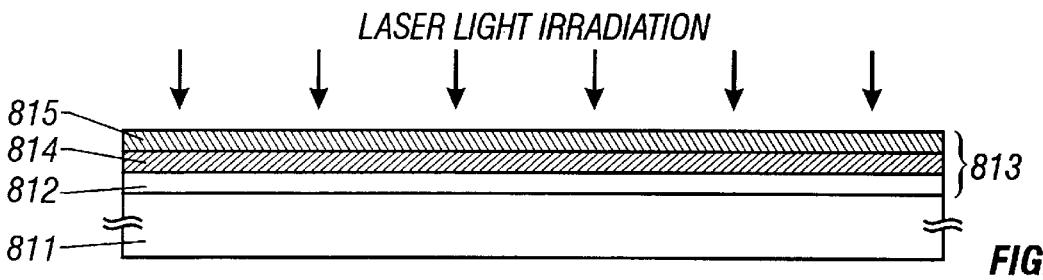

Subsequently, a laser light is irradiated on the crystalline silicon film, to thereby diffuse nickel elements from the layer 815 into the layer 814 (FIG. 9B).

Figure 9C:
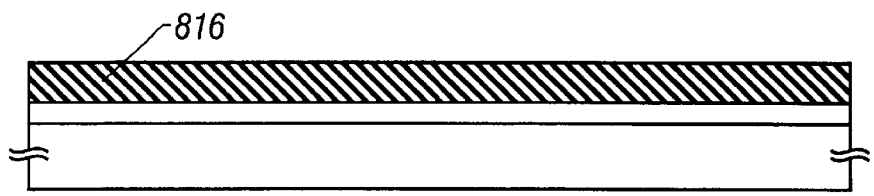

As a result, a crystalline silicon film 816 having a state in which nickel is uniformly diffused in the film is obtained (FIG. 9C).

(Tenth Embodiment)

A tenth embodiment shows that an $Si_xGe_{1-x}$ film (0<x<1) of an amorphous state is used for a film into which nickel elements are diffused (nickel elements are drawn out). The $Si_xGe_{1-x}$ film has a quality which is liable to getter nickel because it has defects caused by its film quality of amorphous. The $Si_xGe_{1-x}$ film is further liable to getter nickel by adding impurities to the $Si_xGe_{1-x}$ film.

A process of manufacturing a crystalline silicon film in accordance with this embodiment will be described with reference to FIG. 1.

A silicon oxynitride film is formed in thickness of 3,000 Å on a Corning 1737 glass substrate 101 (a strain point 667° C.) as an underlayer film 102. Then, an amorphous silicon film 103 is formed in thickness of 600 Å through the plasma CVD method or the low pressure thermal CVD method. Subsequently, a nickel acetate solution adjusted to a predetermined concentration of nickel drops on the amorphous silicon film 103 and spin-coated by using a spinner 100 to form a water film 104. As a result, the nickel elements in the water film 104 are held in contact with the surface of the amorphous silicon film 103 (FIG. 1A).

Then, a heat treatment is conducted to crystallize the amorphous silicon film 103, thus forming a crystalline silicon film 105. In this example, a heat treatment is conducted at 620° C. for 4 hours (FIG. 1B)

The $Si_xGe_{1-x}$ film 107 of the amorphous state is formed in thickness of 600 Å through the plasma CVD method. In the $Si_xGe_{1-x}$ film 107 of the amorphous state, the concentration of oxygen is set to, for example, $1\times10^{19}$ to $1\times10^{21}$ atoms cm$^{-3}$. As a result, since the $Si_xGe_{1-x}$ film 107 contains oxygen as impurities in addition to defects or the like caused by the film quality of amorphous, it has the defects caused by oxide represented by oxygen or $SiO_x$, oxygen between silicon bonding, or the like. Therefore, the film 107 has its quality which is liable to getter nickel.

Then, a heat treatment is conducted on the film 107 with the result that the nickel elements in the crystalline silicon film 105 are diffused into the $Si_xGe_{1-x}$ film 107 through the oxide film 106 (FIG. 1C).

The lower limit of the heating temperature is defined by a temperature at which nickel can be diffused, and is 400° C. or higher. The upper limit of the heating temperature is defined by a temperature at which the $Si_xGe_{1-x}$ film 107 is not crystallized and also the strain point of the substrate. Hence, the heat treatment may be conducted at a temperature of 550 to 1,050° C. In this embodiment, because Corning 1737 of the strain point 667° C. is used as a glass substrate 101 in this embodiment, the heating temperature is set to 600° C., and the heating time is set to 4 hours. The heat treatment allows the nickel elements in the crystalline silicon film 105 to be diffused in the $Si_xGe_{1-x}$ film 107 of the amorphous state, thereby being capable of lowering the concentration of the nickel elements in the crystalline silicon film 105.

The amorphous silicon is caused to be crystallized at a temperature of about 450° C. However, in this embodiment, since the $Si_xGe_{1-x}$ film 107 of the amorphous state contains oxygen with a high concentration such as $10^{19}$ to $10^{21}$ atoms $cm^{-3}$, oxygen prevents the $Si_xGe_{1-x}$ film 107 from being crystallized, and even though the heat treatment is implemented within the above range of temperature, the $Si_xGe_{1-x}$ film 107 can be kept amorphous. Alternatively, the $Si_xGe_{1-x}$ film 107 is not completely crystallized. Hence, even after the heat treatment has been conducted, the $Si_xGe_{1-x}$ film 107 of the amorphous state can be readily etched.

Then, the $Si_xGe_{1-x}$ film 107 is removed by etching. In this situation, an etchant and etching gas which are high in the etching select ratio of the $Si_xGe_{1-x}$ film 107 to the crystalline silicon film 105 are used. As a result, only the $Si_xGe_{1-x}$ film 107 that has drawn out nickel can be selectively removed.

In this embodiment, similarly to the second and fifth embodiments, a silicon oxide film, a silicon nitride film or a silicon oxynitride film which functions as an etching stopper for the $Si_xGe_{1-x}$ film 107 may be formed on the crystalline silicon film 105.

Through the above etching process, the crystalline silicon film 108 which could lower the content concentration of the nickel elements as shown in FIG. 1D is obtained. For example, if the thickness of the crystalline silicon film 105 is to the same degree as that of the $Si_xGe_{1-x}$ film 107, the mean concentration of the nickel elements in the crystalline silicon film 108 can be set to ½ or less by conducting the gettering process of this embodiment.

(Eleventh Embodiment)

In the tenth embodiment, the $Si_xGe_{1-x}$ film (0<x<1) of the amorphous state is prevented from being crystallized in diffusing the nickel elements (drawing out the nickel elements). On the other hand, an eleventh embodiment is that the $Si_xGe_{1-x}$ film of the amorphous state is heated at a temperature where the film is allowed to be crystallized, to thereby diffuse the nickel elements (draw out the nickel elements). Other processes in the eleventh embodiment are identical with that in the tenth embodiment shown in FIG. 1.

In this case, after a crystalline silicon film 105 is obtained as shown in FIG. 1B, a silicon oxide film that functions as an etching stopper is formed.

Subsequently, as shown in FIG. 1B, an $Si_xGe_{1-x}$ film 107 of the amorphous state is formed in thickness of 600 Å through the plasma CVD method. As shown in FIG. 1C, a heat treatment is conducted so that nickel elements in the crystalline silicon film 105 are diffused in the $Si_xGe_{1-x}$ film 107 of the amorphous state through a silicon oxide film that functions as an etching stopper.

In this embodiment, because heating is made at a temperature as high as possible, and a Corning 1737 of a strain point 667° C. is used as a glass substrate 101, the heating temperature is set to 620° C. and the heating time is set to 4 hours. Through the heat treatment, the nickel elements in the crystalline silicon film 105 are diffused in the $Si_xGe_{1-x}$ film 107, thereby being capable of lowering the concentration of the nickel elements in the crystalline silicon film 105.

In this process, because heating is conducted at a temperature where the $Si_xGe_{1-x}$ film 107 is allowed to be crystallized, the $Si_xGe_{1-x}$ film 107 is formed into a crystalline $Si_xGe_{1-x}$ film. Then, an etchant and etching gas which are high in the etching select ratio of the $Si_xGe_{1-x}$ film 107 to the silicon oxide film are used to remove the crystalline $Si_xGe_{1-x}$ film that has drawn out nickel. In this situation, because a silicon oxide film (not shown) which has been formed previously on the surface of the crystalline silicon film functions as an etching stopper, only the crystalline $Si_xGe_{1-x}$ film can be removed selectively. Then, the silicon oxide film that functions as the etching stopper is removed by etching.

As a result, only the $Si_xGe_{1-x}$ film 107 that has drawn out nickel can be selectively removed.

Through the above etching process, a crystalline silicon film 108 which could lower the content concentration of the nickel elements as shown in FIG. 1D is obtained. For example, if the thickness of the crystalline silicon film 105 is to the same degree as that of the $Si_xGe_{1-x}$ film 107, the mean concentration of the nickel elements in the crystalline silicon film 108 can be set to ½ or less by conducting the gettering process of this embodiment.

(Twelfth Embodiment)

A twelfth embodiment is that a heat treatment is conducted in a halogen atmosphere in diffusing metal elements outside of a crystalline silicon film. Other processes of this embodiment are the same as those in the third embodiment.

Figure 10A:
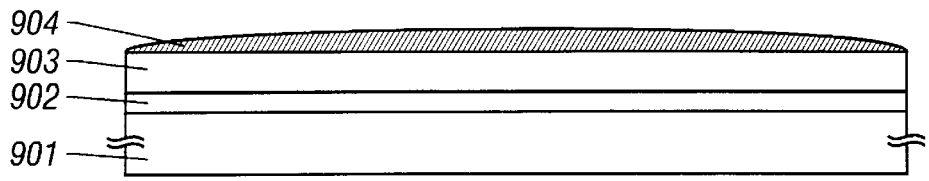
FIGS. 10A to 10E are diagrams showing a process of manufacturing a crystalline silicon film in accordance with a tenth embodiment of the present invention.

As shown in FIG. 10A, an underlayer film 902 is formed on a Corning 1737 glass substrate 901 (a strain point 667° C.). A silicon oxynitride film is formed.

Subsequently, an amorphous silicon film 903 is formed in thickness of 600 Å through the low pressure thermal CVD method. It is important that in forming the film, impurities are prevented from being mixed in the amorphous silicon film 903.

Then, a nickel acetate solution adjusted to a predetermined concentration of nickel drops on the amorphous silicon film 903 to form a water film 904. Thereafter, spin-coating is conducted by using a spinner or the like so that the nickel elements are held in contact with the surface of the amorphous silicon film 903.

Figure 10B:
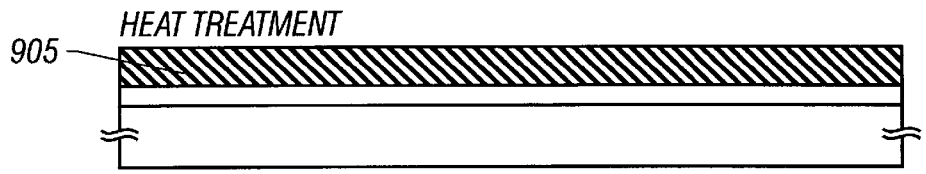

Subsequently, as shown in FIG. 10B, a heat treatment is conducted at a temperature of 450 to 650° C. in a reduction atmosphere to crystallize the amorphous silicon film 903, thus forming a crystalline silicon film 905. In this embodiment, the heat treatment is conducted at 620° C. for 4 hours.

Figure 10C:
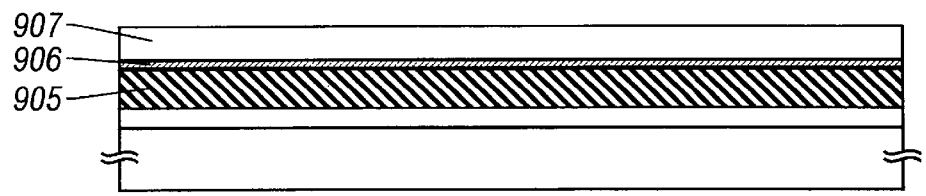

As shown in FIG. 10C, after the crystalline silicon film 905 is obtained, a silicon oxide film 906 is formed in thickness of 10 to 100 Å through the heat oxidization method, and sequentially an amorphous silicon film 907 containing oxygen as impurities is formed in thickness of 600 Å through the low pressure thermal CVD method. The concentration of oxygen in the amorphous silicon film 907 is set to $1\times10^{19}$ to $1\times10^{21}$ atoms $cm^{-3}$. For that reason, the amorphous silicon film 907 has an element (a factor) of gettering nickel such as the defects caused by oxide represented by oxygen or $SiO_x$, and oxygen between silicon bonding, and so on (because it contains oxygen as impurities) in addition to defects or the like caused by the film quality of amorphous.

Thereafter, in order that the nickel elements which have been intentionally mixed for crystallization at an initial stage is removed from the crystalline silicon film 905, a heat treatment is conducted in atmosphere containing halogen elements. In this embodiment, the heat treatment is conducted in the atmosphere containing HCl 5% in oxygen at a temperature of 620° C. for 2 hours, taking the heat resistance of the glass substrate into consideration.

Heating is made to diffuse nickel from the crystalline silicon film 905 into the amorphous silicon film 907, thus removing nickel from the crystalline silicon film 905. For that reason, the concentration of the nickel elements can be reduced to ¹⁄₁₀ of an initial concentration at the maximum in comparison with a case in which chlorine is not supplied during the heat treatment as in the third embodiment.

Also, although the amorphous silicon film 907 is caused to be crystallized by the catalytic action of the nickel elements which are diffused from the crystalline silicon film 905 under the above conditions, the amorphous silicon film 907 is formed into a crystalline silicon film 908 having a large number of defects because it contains oxygen as impurities.

Then, the crystalline silicon film 908 containing the nickel elements with a high concentration is removed using, for example, hydrazine ($N_2H_6$) or $ClF_3$ gas.

Figure 10D:
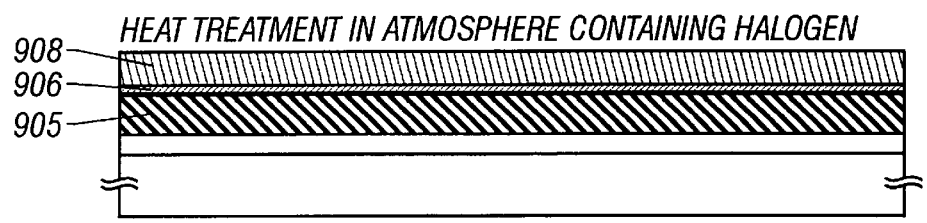
Figure 10E:

Thereafter, the silicon oxide film 906 is removed by buffer hydrofluoric acid or fluorine nitrate, to thereby obtain a crystalline silicon film 909 which could lower the content concentration of the nickel elements as shown in FIG. 10E.

In this embodiment, the amorphous silicon film 907 into which the metal elements are diffused is crystallized in conducting the heat treatment in the halogen atmosphere. Alternatively, the metal elements may be diffused without crystallizing the amorphous silicon film 907 as in the first embodiment. In this case, if a Corning 1737 glass substrate having its strain point of 667° C. is used, the heating temperature may be set to 600° C. and the heating time may be set to 4 hours.

Further, in the case where the amorphous silicon film into which the metal elements are diffused is not allowed to be crystallized, the silicon oxide film 906 that functions as an etching stopper may be omitted.

(Thirteenth Embodiment)

In the twelfth embodiment, in order to remove the nickel elements which have been intentionally mixed for crystallization from the crystalline silicon film, the atmosphere is made to contain 1 to 10% of HCl, for example, 5% in oxygen, in conducting the heat treatment in the atmosphere containing the halogen elements. A thirteenth embodiment uses an atmosphere containing 1 to 10% of HCl in nitrogen. This effect can be obtained in case of using other metal elements.

Other conditions of this embodiment may be identical with those in the twelfth embodiment. As a result, the concentration of the nickel elements can be reduced to $\frac{1}{10}$ of an initial concentration at the maximum in comparison with a case in which chlorine is not supplied during the heat treatment as in the first embodiment.

This embodiment shows an example in which Cl is selected as the halogen elements, and HCl is used as its introducing method. As gas other than HCl gas, one kind or plural kinds of gases selected from HCl, HF, HBr, $Cl_2$, $F_2$ and $Br_2$ may be used. In general, hydride of halogen may be used.

(Fourteenth Embodiment)

A fourteenth embodiment uses a quartz substrate as a substrate in a method for manufacturing the crystalline silicon film shown in the twelfth embodiment. Because the quartz glass can withstand the heating temperature of about 1,000° C., a heat treatment for crystallization in this embodiment is conducted at 950° C. for 4 hours, as shown in FIG. 10B. As a result, a crystalline silicon film can be obtained which is excellent in crystallinity more than the crystalline silicon 905 of the twelfth embodiment.

Also, in the heat treatment for gettering shown in FIG. 10D, heating is made in an atmosphere containing 5% of HCl in oxygen at 950° C. for 2 hours. Other processes of this embodiment are conducted under the same conditions as those in the twelfth embodiment.

According to the measurement through SIMS, the concentration of the nickel elements in the crystalline silicon film 905 was the order of about $10^{18}$ atoms $cm^{-3}$ before implementing the gettering process. However, in this embodiment, because gettering is conducted while heating in the halogen atmosphere and at a high temperature, the concentration can be reduced to the measurement limit ($1\times10^{17}$ atoms $cm^{-3}$) or less of SIMS.

As was described above, according to the present invention, the crystalline silicon film can be manufactured at a low temperature by the action of metal elements. Hence, the crystalline silicon film can be formed on a glass substrate.

Also, the metal elements in the silicon film crystallized by the action of the metal elements are diffused into the amorphous silicon film, thereby being capable of obtaining the crystalline silicon film low in the concentration of the metal elements. Hence, a device which is not adversely affected by the metal elements, for example, a thin-film transistor can be obtained using the crystalline silicon film.

Further, because the protective film that functions as an etching stopper is formed between the silicon film into which the metal elements are diffused and the silicon film to be crystallized, only the silicon film can be selectively removed regardless of whether the silicon film into which the metal elements have been diffused is crystallized, or not.

In addition, because a portion of the crystallized silicon film in which the metal elements are segregated is removed by the action of metal elements, the crystalline silicon film having no portion where the metal elements are segregated can be obtained. As a result, a semiconductor device which is not adversely affected by the metal elements can be obtained.

The foregoing description of a preferred embodiment of the invention has been presented for purposes of illustration and description. It is not intended to be exhaustive or to limit the invention to the precise form disclosed, and modifications and variations are possible in light of the above teachings or may be acquired from practice of the invention. The embodiment was chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. A method for manufacturing a semiconductor film, said method comprising the steps of:

introducing a metal element into an amorphous semiconductor film comprising silicon;

crystallizing said amorphous semiconductor film to form a crystalline semiconductor film comprising silicon;

forming a protective film on said crystalline semiconductor film;

forming an amorphous silicon film including at least an impurity therein on said protective film;

diffusing said metal element into said amorphous silicon film including the impurity therein; and removing said amorphous silicon film including the impurity therein with said protective film as an etching stopper, wherein said impurity comprises at least one element selected from the group consisting of oxygen, carbon and nitrogen.

2. A method according to claim 1, wherein said metal element comprises at least one element selected from the group consisting of Fe, Co, Ni, Ru, Rh, Pd, Os, Ir, Pt, Cu and Au.

3. A method according to claim 1, wherein a concentration of said impurity in said amorphous silicon film is higher than that of said metal element in said crystalline semiconductor film.

4. A method according to claim 1, wherein a thickness of said amorphous silicon film formed on said crystalline semiconductor film is equal to or thicker than a thickness of said crystalline semiconductor film.

5. A method according to claim 1, wherein a concentration of oxygen in the amorphous silicon film on the protective film is in a range of $1\times10^{19}$ to $1\times10^{21}$ atoms $cm^{-3}$, and a concentration of each of carbon and nitrogen in the amorphous silicon film on the protective film is in a range of $1\times10^{17}$ to $1\times10^{20}$ atoms $cm^{-3}$.

6. A method according to claim 1, wherein the metal element is selectively introduced into a portion of the amorphous semiconductor film so that a crystal growth proceeds in a parallel direction.

7. A method according to claim 1, wherein the crystalline semiconductor film is used as an active layer of a thin film transistor.

8. A method according to claim 1, wherein the protective film comprises silicon oxide.

9. A method for manufacturing a semiconductor film, said method comprising the steps of:
    forming an amorphous semiconductor film comprising silicon over a substrate;
    introducing a metal element into said amorphous semiconductor film;
    crystallizing said amorphous semiconductor film to form a crystalline semiconductor film comprising silicon;
    forming a protective film on said crystalline semiconductor film;
    forming an amorphous silicon film including at least an impurity therein on said protective film;
    diffusing said metal element into said amorphous silicon film including the impurity therein by conducting a heat treatment at a temperature of a strain point or less of said substrate; and
    removing said amorphous silicon film including the impurity therein with said protective film as an etching stopper,
    wherein the impurity comprises at least one element selected from the group consisting of oxygen, carbon and nitrogen.

10. A method according to claim 9, wherein said metal element comprises at least one element selected from the group consisting of Fe, Co, Ni, Ru, Rh, Pd, Os, Ir, Pt, Cu and Au.

11. A method according to claim 9, wherein a concentration of said impurity in said amorphous silicon film is higher than that of said metal element in said crystalline semiconductor film.

12. A method according to claim 9, wherein a thickness of said amorphous silicon film formed on said crystalline semiconductor film is equal to or thicker than that of said crystalline semiconductor film.

13. A method according to claim 9, wherein a concentration of oxygen in the amorphous silicon film on the protective film is in a range of $1\times10^{19}$ to $1\times10^{21}$ atoms $cm^{-3}$, and a concentration of each of carbon and nitrogen in the amorphous silicon film on the protective film is in a range of $1\times10^{17}$ to $1\times10^{20}$ atoms $cm^{-3}$.

14. A method according to claim 9, wherein the metal element is selectively introduced into a portion of the amorphous semiconductor film so that a crystal growth proceeds in a parallel direction.

15. A method according to claim 9, wherein the crystalline semiconductor film is used as an active layer of a thin film transistor.

16. A method according to claim 9, wherein the protective film comprises silicon oxide.

17. A method for manufacturing a semiconductor film, said method comprising the steps of:
    forming an amorphous semiconductor film comprising silicon over a substrate;
    introducing a metal element into said amorphous semiconductor film;
    crystallizing said amorphous semiconductor film to form a crystalline semiconductor film comprising silicon;
    forming a protective film on said crystalline semiconductor film;
    forming an amorphous silicon film including at least an impurity therein on said protective film;
    diffusing said metal element into said amorphous silicon film including the impurity;
    removing said amorphous silicon film including the impurity therein with said protective film as an etching stopper;
    removing said protective film; and
    conducting at least one of heating and irradiating with a laser light with respect to said crystalline semiconductor film,
    wherein the impurity comprises at least one element selected from the group consisting of oxygen, carbon and nitrogen.

18. A method according to claim 17, wherein said metal element comprises at least one element selected from the group consisting of Fe, Co, Ni, Ru, Rh, Pd, Os, Ir, Pt, Cu and Au.

19. A method according to claim 17, wherein a concentration of said impurity in said amorphous silicon film is higher than a concentration of said metal element in said crystalline semiconductor film.

20. A method according to claim 17, wherein a thickness of said amorphous silicon film formed on said crystalline semiconductor film is equal to or thicker than that of said crystalline semiconductor film.

21. A method according to claim 17, wherein a concentration of oxygen in the amorphous silicon film on the protective film is in a range of $1\times10^{19}$ to $1\mathrm{xx}\ 10^{21}$ atoms $cm^{-3}$, and a concentration of each of carbon and nitrogen in the amorphous silicon film on the protective film is in a range of $1\times10^{17}$ to $1\times10^{20}$ atoms $cm^{-3}$.

22. A method according to claim 17, wherein the metal element is selectively introduced into a portion of the amorphous semiconductor film so that a crystal growth proceeds in a parallel direction.

23. A method according to claim 17, wherein the crystalline semiconductor film is used as an active layer of a thin film transistor.

24. A method according to claim 17, wherein the protective film comprises silicon oxide.

25. A method for manufacturing a semiconductor film, said method comprising the steps of
    introducing a metal element into an amorphous film comprising silicon;
    crystallizing said amorphous semiconductor film to form a crystalline semiconductor film comprising silicon;
    forming an amorphous semiconductor film including silicon and at least an impurity therein over said crystalline semiconductor film;

diffusing said metal element into said amorphous semiconductor film including silicon and the impurity therein; and removing said amorphous semiconductor film including silicon and the impurity therein, wherein the impurity comprises at least one element selected from the group consisting of oxygen, carbon and nitrogen.

26. A method according to claim 25, wherein a concentration of oxygen in the amorphous semiconductor film over the crystalline semiconductor film is in a range of $1\times10^{19}$ to $1\times10^{21}$ atoms $cm^{-3}$, and a concentration of each of carbon and nitrogen in the amorphous semiconductor film over the crystalline semiconductor film is in a range of $1\times10^{17}$ to $1\times10^{20}$ atoms $cm^{-3}$.

27. A method according to claim 25, wherein the metal element is selectively introduced into a portion of the amorphous semiconductor film so that a crystal growth proceeds in a parallel direction.

28. A method according to claim 25, wherein the crystalline semiconductor film is used as an active layer of a thin film transistor.

29. A method according to claim 25, wherein the protective film comprises silicon oxide.

* * * * *